(12) United States Patent
Gerlach et al.

(10) Patent No.: US 6,900,447 B2
(45) Date of Patent: May 31, 2005

(54) FOCUSED ION BEAM SYSTEM WITH COAXIAL SCANNING ELECTRON MICROSCOPE

(75) Inventors: Robert L. Gerlach, Portland, OR (US); Mark W. Utlaut, Scappoose, OR (US); Michael R. Scheinfein, West Vancouver (CA)

(73) Assignee: FEI Company, Hillsboro, OR (US)

( * ) Notice: Subject to any disclaimer, the term of this patent is extended or adjusted under 35 U.S.C. 154(b) by 47 days.

(21) Appl. No.: 10/635,228

(22) Filed: Aug. 6, 2003

(65) Prior Publication Data

US 2004/0108458 A1 Jun. 10, 2004

Related U.S. Application Data

(60) Provisional application No. 60/401,718, filed on Aug. 7, 2002.

(51) Int. Cl.[7] .............................. H01J 37/26; H01J 37/12
(52) U.S. Cl. ................................. 250/494.1; 250/492.2; 250/492.21; 250/492.3; 250/396 ML; 250/396 R
(58) Field of Search .............................. 250/396 ML, 396 R, 250/494.1, 492.2, 492.21

(56) References Cited

U.S. PATENT DOCUMENTS

| | | | |
|---|---|---|---|
| 3,845,305 A | * | 10/1974 | Liebl ........................ 250/309 |
| 4,426,582 A | | 1/1984 | Orloff et al. |
| 4,629,898 A | | 12/1986 | Orloff et al. |
| 4,818,872 A | * | 4/1989 | Parker et al. ............... 250/309 |
| 6,522,056 B1 | | 2/2003 | Mauck |
| 6,683,320 B2 | * | 1/2004 | Gerlach et al. .......... 250/494.1 |
| 2001/0032938 A1 | | 10/2001 | Gerlach et al. |
| 2001/0032939 A1 | | 10/2001 | Gerlach et al. |
| 2002/0134949 A1 | | 9/2002 | Gerlach et al. |

OTHER PUBLICATIONS

Gnauck Peter: "A New Crossbeam Inspection Tool Combining An Ultrhigh Resolution Field Emmission SEM And A High resolution FIB" Proceeding od the SPIE, SPIE. Bellingham, VA, US vol. 4889, Mar. 4, 2002 pp. 833–840.

* cited by examiner

Primary Examiner—John R. Lee
Assistant Examiner—Kalimah Fernandez
(74) Attorney, Agent, or Firm—Michael O. Scheinberg

(57) ABSTRACT

A system including co-axial focused ion beam and an electron beam allows for accurate processing with the FIB using images formed by the electron beam. In one embodiment, a deflector deflects the electron beam onto the axis of the ion beam and deflects secondary particles collected through the final lens toward a detector. In one embodiment, a positively biased final electrostatic lens focuses both beams using the same voltage to allow simultaneous or alternating FIB and SEM operation. In one embodiment, the landing energy of the electrons can be varied without changing the working distance.

36 Claims, 15 Drawing Sheets

FOCUSED ION BEAM SYSTEM WITH COAXIAL SCANNING ELECTRON MICROSCOPE

This application claims priority from U.S. Provisional Pat. App. 60/401,718, filed Aug. 7, 2002, which is hereby incorporated by reference.

TECHNICAL FIELD OF THE INVENTION

The present invention relates to the fields of electron beam imaging and micromachining microscopic features using charged particle beams.

BACKGROUND OF THE INVENTION

Various nanofabrication, lithography, sample preparation, metrology, or inspection applications of focused ion beam (FIB) systems require very accurate placement of the FIB milling beam (on a nanometer scale). When the FIB beam is employed to form an image of the work piece to align the beam for milling, sample damage may result by exposing sensitive regions to the high-energy ion beam.

Dual beam systems, including a FIB and a scanning electron microscope (SEM), have been introduced which can image the sample with the SEM and mill on the sample using the FIB. Some dual beam instruments utilize coincident FIB and SEM beams, where the beams are incident upon the surface with a large angle between them. The sample may be tilted towards or away from each beam axis to facilitate various SEM and FIB milling operations. Another type of dual beam instrument employs parallel FIB and SEM beams or adjacent beams with an angle between the beams with sample stage motion between the two beams. In either case, the placement accuracy of the FIB beam to the SEM image has limitations due to stage inaccuracies, sample non-flatness, and—in the case of coincident beams—the different beam angles.

What is needed is a way to combine the micromachining capabilities of a FIB system with the superior and non-destructive imaging of a SEM (so that a SEM image could be used to align the FIB for milling) without the placement inaccuracy inherent in existing dual beam designs. A number of steps in the mass production of nanodevices would benefit from such a combination FIB-SEM, including, for example, the manufacture of thin film magnetic heads for use in computer hard drives or similar devices. The phrase "mass production of nanodevices" as used herein encompasses manufacturing, nanofabrication, lithography, sample preparation, metrology, and inspection applications.

As the computer industry continues to demand higher capacity and faster performance from hard disks and tape drives, there is an increasing demand for suppliers to increase the amount of data that can be stored on a given storage medium. This amount of data, referred to as areal density, is usually expressed as the number of bits of data per square inch of storage media.

In a typical hard disk, the data is stored on round, flat disks called platters, usually made of glass or an aluminum alloy. A platter is coated on both sides with a very thin layer of magnetic material, which is designed to store information in the form of magnetic patterns. The platters are mounted inside the hard disk cover by cutting a hole in the center of each platter and stacking several platters onto a spindle. The platters can be rotated at high speed by a motor connected to the spindle. Special electromagnetic read/write devices called heads are used to either record information onto the disk or read information from it. These heads are mounted onto sliders, which are in turn mounted onto arms. All of the arms are mechanically connected into a single assembly and positioned over the surface of the disk by a device called an actuator. In this fashion, the read/write heads can be accurately positioned over the surface of the platters.

The read/write heads transform electrical signals to magnetic signals, and magnetic signals back to electrical ones again. Each bit of data to be stored is recorded onto the hard disk using a special encoding method that translates zeros and ones into patterns of magnetic flux reversals.

Each surface of each platter on the disk can hold tens of billions of individual bits of data. These are organized into larger "chunks" for convenience, and to allow for easier and faster access to information. Each platter has two heads, one on the top of the platter and one on the bottom, so a hard disk with three platters would normally have six surfaces and six total heads. Each platter has its information recorded in concentric circles called tracks. Each track is further broken down into smaller pieces called sectors, each of which holds 512 bytes of information.

The portion of a write head that actually writes data on the disk is referred to as the write element. This element is typically made up of two poles that are separated by a gap. These poles generate a magnetic field when they are excited by a coil magnetically coupled to the poles. When the write element is in proximity to the disk, a magnetic field generated by the poles sets the magnetic orientation in given locations on the disk. In this manner, data is written on the disk.

One of the major factors that determines the areal density of a hard disk is the track density. This is a measure of how tightly the concentric tracks on the disk can be packed.

Track density is largely determined by the size of the area of the disk that is affected by the write head. A large head structure will affect a larger area on the surface of a platter than will a smaller head structure. As a result, track width can be decreased (and track density increased) by making the poles of the write head physically smaller at the write tip, thereby concentrating the magnetic field into a smaller area on the platter surface.

A large percentage of the write heads used today are thin-film heads, so named because of the way in which they are manufactured. Thin film heads are made using a photo-lithographic process similar to the way integrated circuits are made. During the manufacturing process, a substrate wafer is coated with one or more layers of a very thin film of alloy material deposited in specific patterns. Alternating layers of an insulating material are also deposited onto the substrate. Lithographic techniques are used to form the deposited layers into a pole-tip assembly having the desired geometry.

However, there is a limit on how small a write head can be manufactured using lithographic techniques alone. Smaller write heads often require micromachining with a focused ion beam device.

FIB systems are widely used in microscopic-scale manufacturing operations because of their ability to image, etch, mill, deposit, and analyze very small features with great precision. Ion columns on FIB systems using gallium liquid metal ion sources (LMIS), for example, can provide five to seven nanometer lateral imaging resolution. Focused ion beams mill by sputtering, that is, physically removing atoms and molecules from the specimen surface. Because of their versatility and precision, FIB systems are employed in the fabrication of thin film magnetic heads used for writing information to data storage media.

FIB systems operate by directing a focused beam of ions over the surface of a work piece, typically in a raster pattern. The ions are typically extracted from a liquid metal ion source (LMIS). The extracted ions are accelerated, collimated, and focused onto a work piece by a series of apertures and electrostatic lenses. Electrostatic lenses are used because the ions are too massive to be focused by reasonably sized magnetic lenses; gallium ions are about 128,000 times heavier than electrons. A common type of electrostatic lens used to focus an ion beam is an einzel lens. An einzel lens is a unipotential lens with three electrodes or elements. Typically, the center element is at a high positive potential and the upper and lower elements are maintained at ground potential.

When a FIB system is used, first the ion beam typically scans the surface of the specimen in a raster pattern and secondary electrons are collected to form an image of the specimen surface. This image can be used to identify the features to be milled. The ion beam scan pattern is then adjusted to coincide with the feature to be milled, and the ion beam is used to mill the surface. A gaseous material is often directed to the work piece at the impact point of the ion beam, and the ions induce a chemical reaction that selectively either increases the etch rate or deposits material, depending on the gaseous compound that is used. Unfortunately, thin film head trimming and other nanofabrication applications may suffer from sample damage during the FIB image processes. If the FIB beam image time is reduced to decrease sample damage, the image signal-to-noise ratio may be insufficient for accurate milling placement. In other cases, it may be undesirable to ever direct the FIB beam at certain sensitive structures.

In contrast to FIB imaging, a low energy electron beam as used in a scanning electron microscope (SEM) causes less damage to the work piece and has greater alignment accuracy. In a scanning electron microscope, a finely focused beam of electrons is scanned across the surface of a work piece. The electron beam originates from an electron source and the electrons are accelerated toward the work piece by a voltage, usually between 0.2 kV and 30 kV. That beam is typically collimated by electromagnetic condenser lenses, focused by an objective lens, and scanned across the surface of the work piece by electromagnetic deflection coils. When the electrons in the electron beam strike the work piece surface, secondary electrons are emitted. As in a FIB system, these secondary electrons are collected and used to form an image of the work piece surface in which the brightness of each point on the image is determined by the number of secondary electrons ejected while the primary electron beam was impinging at that point. The finely focused electron beam of an SEM allows for the production of an image of greater magnification and higher resolution than can be achieved by the best optical microscopes.

Since electrons can be focused either by electrostatic forces or magnetic forces, both electrostatic and magnetic lenses can be found in SEMs. Electrostatic lenses usually have larger aberrations than magnetic lenses (particularly for higher beam voltages) so they are not as commonly used.

Unlike imaging with an ion beam, SEM imaging usually does not significantly damage a work piece surface. This is because electrons cannot sputter material the way that ions can. The amount of momentum that is transferred during a collision between an impinging particle and a substrate particle depends not only upon the momentum of the impinging particle, but also upon the relative masses of the two particles. Maximum momentum is transferred when the two particles have the same mass. When there is a mismatch between the mass of the impinging particle and that of the substrate particle, less of the momentum of the impinging particle is transferred to the substrate particle. A gallium ion used in focused ion beam milling has a mass of over 128,000 times that of an electron. As a result, the momentum of particles in a gallium ion beam is sufficient to sputter molecules from the surface. However, the momentum of an electron in a typical SEM electron beam is not sufficient to remove molecules from a surface by momentum transfer.

Although an SEM beam is typically much less destructive than an ion beam, certain work pieces, such as some integrated circuits, are susceptible to damage by higher energy electron beams. For this reason, flexibility in electron landing energies, particularly in relatively low voltage ranges, is important when using the electron beam to view these types of work pieces.

The Dual FIB-SEM systems currently available use separate optical columns for the ion and electron beams, and typically there is about 52 degrees between the two beam axes. Minor differences in the distances between final lens of each system and the work piece affect the relative positions of the two beams, so there is always misalignment when switching between the beams. Because there are two different optical columns (each at a different angle to the sample), the sample sometimes has to be tilted to change from FIB to SEM operation (or from SEM to FIB). Some sample displacement is inevitably caused during stage tilt. During any subsequent process such as high precision micromachining, the beam placement accuracy is decreased. Even if the sample displacement problem is overcome, the images obtained by the electron beam and the ion beam will still be different since the beams are incident from two directions. In addition, if the detector is on the side, image shadowing will result, which is sometimes undesirable.

For a combined FIB-SEM to be optimal for the mass production of nanodevices, such as thin film magnetic head manufacturing, both beams should preferably come from above the work piece in a coaxial fashion, so that minor variations in work piece distance from the final lens will not affect the relative positions of the two beams on the same work piece. Because of the high degree of accuracy required, any displacement of either the work piece and particle beam sources must be avoided.

While coaxial column FIB-SEM systems have been described in the literature, all such systems existing to date suffer from design characteristics that limit their usefulness for high-precision or mass production applications.

A single optical column FIB and electron beam system is described in U.S. Pat. No. 4,740,698, to Tamura et al. for "Hybrid Charged Particle Apparatus." In this system, however, separate ion and electron sources are mounted on a changeover device employed to switch between ion and electron beams. The displacement of source position involved in the switch-over also leads to a relative shift between the FIB and the electron beam images.

Another single column FIB/electron beam device is described in Japanese Patent No. 63-236251, to Sawaragi for "Electron Beam/Ion Beam Combination Device." In this system, however, an electromagnetic lens is used to focus the ion beam while a separate electrostatic lens is used to focus the ion beam. When the electron beam is in use, the electromagnetic lens used to focus the electron beam is switched on, but the electrostatic lens is switched off. Before the ion beam can be used, the electron beam is shut off and the electromagnetic lens is switched off. The ion beam and the electrostatic lens are then switched on. As a result, the beams cannot operate simultaneously. When a lens is switched on, a period of time is required for the lens to stabilize, making such a system unsuitable for a high throughput production environment. Also, magnetic lenses have hysteresis effects, which inhibit accurate beam placement after shutting the lens off.

Another single column FIB/electron beam device is described in Japanese Patent No. 02-121252, to Sawaragi for a "Charged Particle Beam Combination Device." ("Sawaragi II"). This system uses a combination of a magnetic and an electrostatic lens in series to focus the electron and ion beams respectively. Although this system does allow simultaneous use of the beams, the use of lenses in series results in an increase in focal length, which typically degrades the resolution of the FIB system. The Sawaragi II patent also uses post-lens deflection to position the beams. This also requires an increased focal length and limits secondary electron collection efficiency and accuracy when using through-the-lens detection of secondary electrons (discussed in greater detail below). As a result, the design of the Sawaragi II patent does not provide the resolution required for advanced thin film head trimming and other nanofabrication applications. Further, a combination lens system will necessarily be physically larger than a single lens system. Smaller systems are desirable because many systems are located in a clean room, and the cost of clean room space is extremely high. Finally, the combination lens system used by the Sawaragi II patent is more complex than a single lens system. This tends to reduce the reliability of such a system and make it less suitable for mass production manufacturing. Still another single column FIB/electron beam device is described in Cleaver et al., "A Combined Electron and Ion Beam Lithography System," J. Vac. Sci. Technol. B, 144 (1985) (hereinafter "Cleaver"). However, the system described in Cleaver uses an einzel lens—a unipotential electrostatic lens—to focus both the ion and electron beams. As such, the ratio of the ion beam energy to the electron beam energy determines the distance from the final lens at which the beams focus. Changing the energy of either beam therefore requires that the work piece be moved to be at the new focus point for that beam. The Cleaver system does not provide the flexibility to readily adjust the beam voltage for different applications. For example, in semiconductor applications, users prefer a low SEM beam voltage to avoid surface damage by electrical charging. Further, any adjustment in beam voltage requires a change in the voltage of the middle element of the einzel lens. A large voltage change in the final lens can take as much as one second—a significant amount of time in the mass production process.

Thus, a single column FIB-SEM system suitable for high-accuracy mass production of nanodevices is still needed.

SUMMARY OF THE INVENTION

An object of the invention, therefore, is to combine the micromachining capabilities of a FIB system and the superior and non-destructive imaging of a SEM in an instrument suitable for high-accuracy mass production of nanodevices. A preferred embodiment of the invention described and claimed herein comprises a combination FIB and SEM sharing a final electrostatic lens and having a common axis as the beams approach the work piece.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
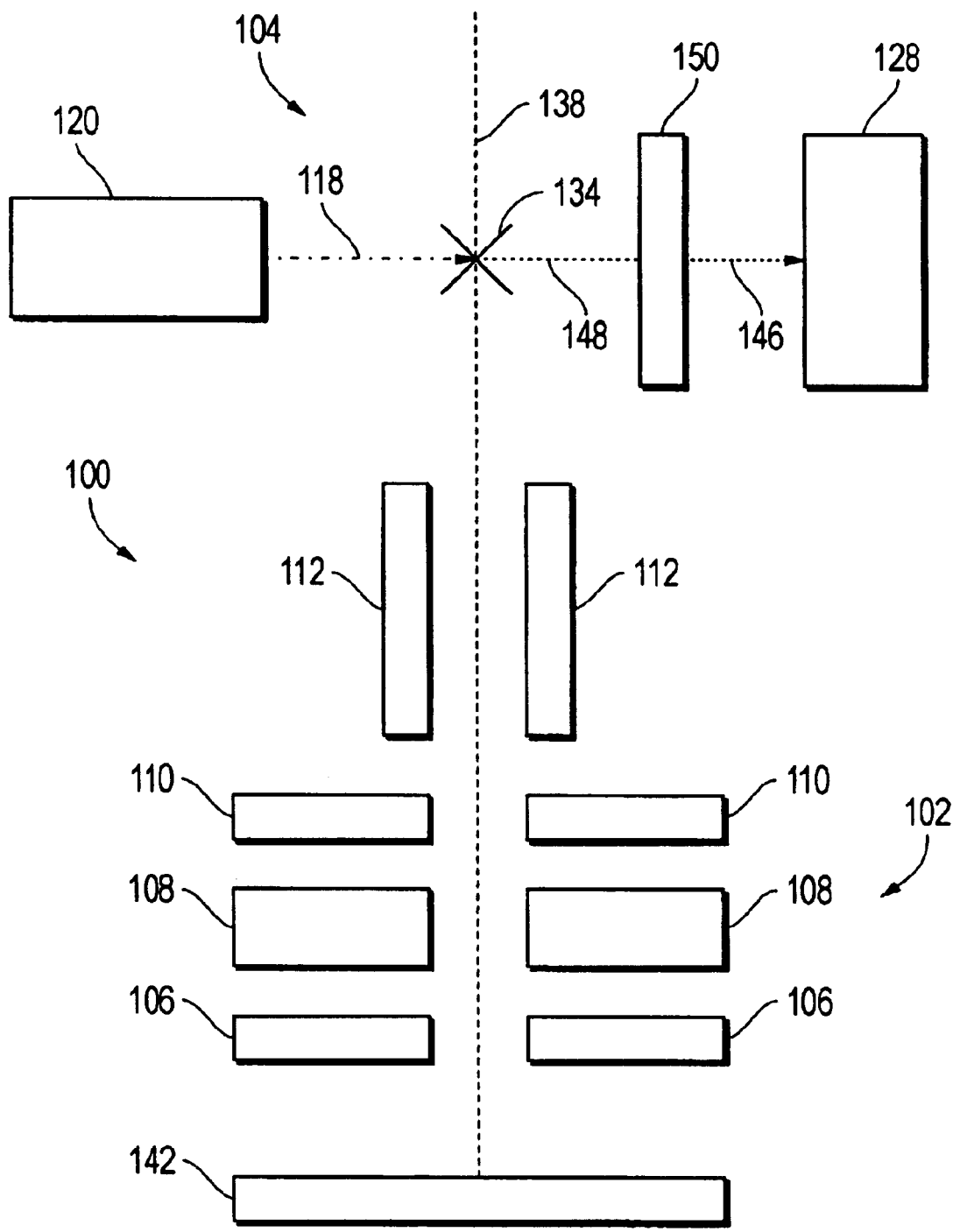
FIG. 1 is a schematic cross-sectional view of a FIB column that delivers neutralizing electrons through its final lens and can also collect secondary electrons through its final lens

The embodiments described below accomplish several different design goals for a FIB-SEM device sharing a final lens and having both beams approximately coaxial as they approach the work piece. The SEM alignment of FIB milling is accurate enough to allow processing such as manufacturing, modification, sample preparation, or metrology of various nanodevices, and it avoids the sample damage that results from FIB imaging. Optional through-the-lens detection of secondary electrons allows the sample to be placed close to the final lens, thus shortening the working distance and improving performance.

Throughput will be improved since the final lens high voltage need not be adjusted when changing beams. Mass production—including modification, sample preparation, and metrology—requires that any necessary micromachining be done very rapidly. A large voltage change in the final lens can take as much as 1 second—a significant amount of time in the mass production process. Therefore, a single column FIB-SEM that does not require a large voltage change when switching from SEM to FIB operation is desirable.

In the present invention, the electrostatic final lens, which does not depend on magnetic fields, simultaneously focuses both beams without having to physically change lenses or even change the final lens voltage. The positively biased final lens focuses both the high energy ion beam and the relatively low energy electron beam by functioning as an acceleration lens for the electrons and as a deceleration lens for the ions. Electrostatic lenses focus more strongly in deceleration mode, so the focusing power of the positively biased lens is less for the negatively charged primary electron beam than for the positively charged primary ion beam, thereby allowing both the high energy ion beam and the relatively low energy electron beam to be focused by the same lens. A relatively low energy electron beam is desirable in many applications, such as integrated circuit applications, in which a high energy beam could damage the work piece.

Further, the energies of the ion beam and the electron beam can be independently adjusted without changing the working distance, that is, the distance from the final lens to the work piece. In prior art unipotential electrostatic final lens, the ratio of beam energies was fixed by the geometry of the final unipotential lens and the working distance. Changing the energy of either beam required significant changes to the potential of the high voltage center lens element, which changed its focal point. This required changing the working distance, that is, placing the sample at a different distance from the lens. Also, significantly changing the high voltage required time for the new high voltage to stabilize.

By allowing independent adjustment of the potential of the upper lens element or the lower lens element of the final lens, applicants provide the flexibility to vary the energies of the beams, particularly the electron beam energy, without significantly changing the working distance. Although non-unipotential lenses have been used for FIB gun lenses and electron beam final lenses, applicants are unaware of the use of a non-unipotential lens as a final lens of an ion beam column.

The invention allows the energy of the electron beam to be changed with minimal effect to the ion beam. The invention provides flexibility for varying the electron beam energy particularly in relatively low voltage ranges, for example, between about 200 V and about 3,000 V, by changing the potential difference between the electron gun and the work piece.

The elements in the electron beam optical path can be divided into a first group below the high voltage element of the final lens and a second group above the high voltage element of the final lens. The first group includes the lower lens element of the final lens and the work piece. The second group includes the upper lens element of the final lens, electrostatic beam steering electrodes, an electron beam deflector, and an electron gun. (It will be understood that the "electron gun potential" means the electrical potential of the last element as the electrons leave the gun, and that elements within the electron gun will be at different potentials relative to the gun potential in order to extract the electrons and accelerate them, thereby providing them with kinetic energy as they leave the gun.) The electrical potentials on elements within each group are approximately the same. That is, the lower lens element and the work piece, are maintained at approximately a first potential, and the upper lens elements, beam steering electrodes, electron beam deflector, and electron gun are maintained at approximately a second potential.

The kinetic energy of the electrons leaving the electron gun and the difference between the first and second potentials determines the landing energy of the electrons in the primary electron beam. In some embodiments, the first potential is approximately ground potential, and the electron beam energy is varied by changing the second potential. In other embodiments, the second potential is approximately ground potential, and the electron beam energy is changed by changing the first potential. Although the two embodiments are equivalent in terms of beam energies, one or the other embodiment may be easier to implement for a given application.

The range of electron energies achievable can be varied by changing the geometry, such as the bore, of an element of the final lens. For example, as described below, with a 40,000 V center lens element, varying the work piece and final lens element voltage can produce an electron beam diameter of less than 10 nm over a range of electron beam energies from 1,000 eV to 4,100 nm when using a 2 mm lower lens element bore or over a range electron beam landing energies from 250 eV to 3,000 eV when using a 3 mm lower lens element bore, while keeping the focused ion beam energy nearly constant.

This flexibility in electron landing energies provided by the invention is important for using the electron beam to view work pieces, such as some integrated circuits, that are susceptible to damage by higher energy electron beams. The present invention allows a beam voltage to be chosen that provides adequate resolution with reduced possibility of damage to the work piece.

Although both beams can operate simultaneously, it can be difficult to isolate the signal from the secondary electrons generated by the electron beam from the signal from the secondary electrons generated by the ion beam. Suitable energy filtering can eliminate some, but not all, of the mixed signal. When operated simultaneously, the ion beam and the electron beam will scan in opposite directions. The invention also allows the electron and ion beams to operate sequentially but with very rapid switching between the two beams.

The present invention also allows for a combination FIB-SEM that is relatively small compared to prior art systems. Smaller systems are desirable because many systems are located in a clean room, and the cost of clean room space is extremely high. Also, a smaller system can be less expensive to manufacture. By using an electrostatic final lens, instead of a combination of electrostatic and magnetic lenses, construction of the system is simplified and reliability improved.

FIG. 1 is a schematic cross-sectional view of a FIB column that delivers neutralizing electrons through its final lens and can also collect secondary electrons through its final lens. This system is described in greater detail in U.S. patent application Ser. No. 09/780,876, to Gerlach et al., for "Through-the-Lens-Collection of Secondary Particles for a Focused Ion Beam System" which is hereby incorporated by reference. FIG. 1 shows a system 100 that provides for charge neutralization by directing neutralizing electrons through a final ion beam lens 102 of an ion optical column 104. Final lens 102 includes three elements: a lower lens element 106, preferably maintained at the same potential as the work piece (approximately ground potential); a middle lens element 108, preferably maintained at about +20,000 V; and an upper lens element 110, preferably maintained at about between +500 V and +5,000 V, most preferably at about +2,000 V. Electrostatic deflectors 112 are preferably maintained at the same potential as lens upper element 110, that is, most preferably at about +2,000 V.

A source of neutralizing electrons 118, such as an electron flood gun 120, is positioned opposite a secondary electron detector 128. The neutralizing electrons 118 from flood gun 120 are deflected by a magnetic deflector 134, where it or an electrostatic shield within the magnetic deflector is maintained at a potential of approximately +2,000 V, towards a primary ion beam axis 138 and down towards a work piece 142, which is preferably maintained at approximately ground potential. An electrostatic deflector or a Wien filter may also be useable in place of magnetic defector 134.

The impact of the ions in the primary ion beam and the neutralizing electrons both cause the ejection of secondary electrons. Secondary electrons ejected by the impact on work piece 142 of ions in the primary beam are referred to as ion-beam-generated secondary electrons 146. Secondary electrons ejected by the impact of neutralizing electrons on work piece 142 are referred to as ion-beam-generated secondary electrons 148.

The difference in electrical potential between the electron source in the electron flood gun 120 and work piece 142 determines the energy that the neutralizing electrons 118 will have upon reaching the work piece 142. For example, for neutralizing electrons generated from a flood gun source maintained at −10 to −500 V with respect to work piece 142, the neutralizing electrons will have a corresponding energy of −10 to −500 V as they strike the ground potential surface of work piece 142. These neutralizing electrons can then generate secondary electrons having a maximum energy of only 10 to 500 eV.

The neutralizing-electron-generated secondary electrons 146 will travel back up the optical column 104 along with the ion-beam-generated secondary electrons 148. The neutralizing-electron-generated secondary electrons 148 would interfere with imaging if they were not separated from the ion-beam-generated secondary electrons 146 before detection. Secondary electrons 146 and 148 traveling up the optical column are bent towards secondary electron detector 128 by the magnetic deflector 134. A high pass electron energy filter, such as a retarding field filter 150, is positioned before the electron detector 128 to reject the flood gun-generated electrons 148.

Figure 2:
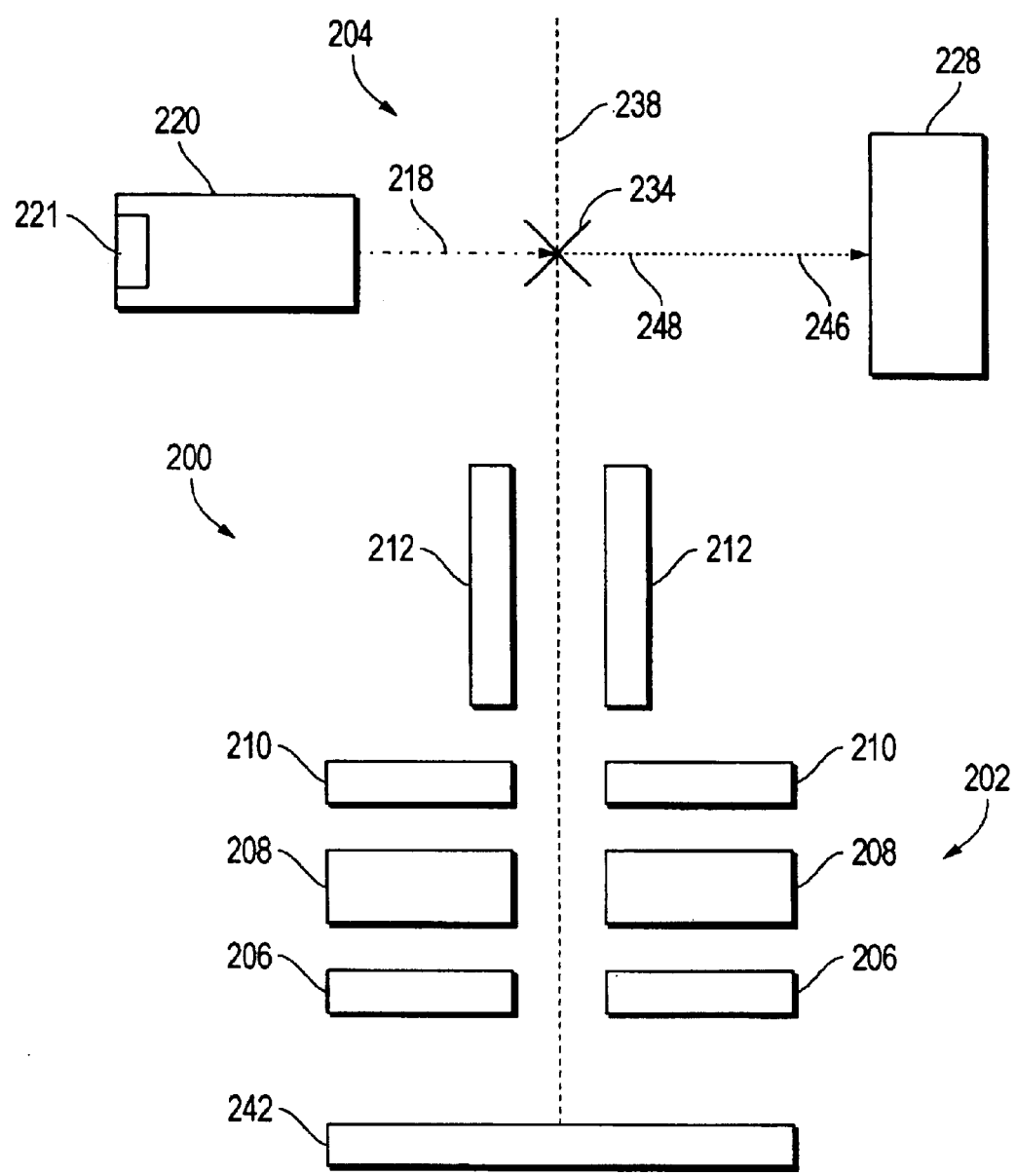
FIG. 2 is a schematic cross-sectional view of a coaxial FIB-SEM column that collects secondary electrons through its final lens.

FIG. 2 is a schematic cross-sectional view of a system 200 including a focused ion beam 238 and a focused electron beam 218. The electron 218 beam and ion beam 238 are coaxial as they approach the work piece. The system of FIG. 2 also is capable of collecting secondary electrons through its final lens. An electron gun 220, such as a Schottky electron gun, provides an electron beam and is positioned opposite a secondary electron detector 228. Electron gun 220 includes electrical connections so that its voltage can be "floated" without changing the relative voltages within electron gun 220 and without changing its focal length. Electron gun 220 is preferably maintained at a potential of about −2,000 V.

The electron beam 218 from electron gun 220 is deflected by a magnetic deflector 234 towards a primary ion beam axis 238 and down towards a work piece 242, which is preferably maintained at approximately ground potential. Electron gun 220 is preferably focused at the center of magnetic deflector 234. Due primarily to the differences between mass and energy of gallium ions and electrons, discussed in greater detail below, magnetic deflector 234 has little effect upon FIB beam 238. An electrostatic deflector or a Wien filter may also be used in place of magnetic defector 234, although an electrostatic deflector cannot simultaneously separate secondary electrons collected through the lens and bend the primary electron beam, and a Wien filter will require a more shallow angle between the original electron beam axis and the ion beam axis.

A preferred final lens 202 includes three elements: a lower lens element 206, typically maintained at the same potential as the work piece; a middle, high voltage lens element 208; and an upper lens element 210, typically maintained at the same potential as the optical components that are positioned above it and described in more detail below. Each lens element is insulated from the other lens and each has an electrical connection so that a different voltage can be applied to each lens element. Additional lens elements could also be used, for example, an additional element could be place below the high voltage element or an additional positive potential lens could be added.

As described above, lower lens element 206 is typically maintained at approximately the same electrical potential as the work piece 242, although the potential may be somewhat different, and middle lens element 208 is typically maintained at a high voltage. Upper lens element 210, electrostatic deflectors 212, and magnetic deflector 234 are preferably all maintained at approximately the same potential. In one embodiment, the lower lens element 206 and work piece 242 are maintained at approximately ground potential; the middle lens element 208 is preferably maintained at between about 5,000 V and about 50,000 V, and more preferably about +40,000 V, and the upper lens element 210, electrostatic deflectors 212, and magnetic deflector 234 are preferably maintained at the same potential as the electron gun potential, between about +100 V and about +5,000 V, most preferably at about +2,000 V.

In another embodiment, the work piece 242 and the lower lens element 206 are maintained at between about −100 V and about −5,000 V, most preferably at about approximately −2,000 V, and the upper lens element 210, electrostatic deflector 212, magnetic deflector 234, electron gun 220 are maintained at approximately ground potential. When work piece 242 and lower lens element 206 are maintained at a potential other than ground potential, it is necessary to electrically bias to the same potential other hardware, such as gas injectors, that are positioned in the vicinity of the work piece 242. Maintaining the work piece 242 at ground potential eliminates the requirement to bias other devices in the vicinity, but requires maintaining an electrical bias on the upper elements in the column. Column designers can chose which elements they prefer to bias.

The kinetic energy of electrons leaving electron source 221 inside electron gun 220 and the difference in electrical potential between the electron source 221 and work piece 242 determines the energy that the electrons in electron beam 218 will have upon reaching the work piece 242. As described above, the difference in potential can be achieved by biasing the electron gun 220, by biasing the work piece, or by biasing both. By "biasing the electron gun" is meant changing the gun potential as described above, that is, superimposing a bias voltage onto all elements of the gun, for example, the emitter, suppressor, and extractor at the bias voltage; the relative potential between components within the electron gun are unchanged as all elements of the entire gun is uniformly biased. The gun elements are "floated" at the bias voltage.

The focus of the electron gun is unchanged when all elements are uniformly biased. The electron gun is preferably focused at the center of the magnetic deflector 234. Maintaining the gun at the same potential as the magnetic deflector maintains the beam focus in the magnetic deflector without further adjustments to the electron gun. Gun elements positioned after the extractor, such as a condenser lens, an acceleration element or optional steering plates, are preferably at the same potential as the bending magnet 234, electrostatic deflectors 212, and upper lens element 210. The negative potential at the emitter is always greater than the work piece potential, or electrons will not reach the work piece. The potential at the emiter is preferably between –20 V and –10,000 V greater than the work piece potential. The voltage difference between the filament and extractor is high enough to provide sufficient kinetic energy to the electrons to form a beam.

In many applications it is preferable to bias the electron gun because, as described above, biasing the work piece requires biasing other devices in the vicinity of the work piece. For example, for electrons generated from an electron emitter maintained at –2,000 V with respect to work piece 242, the electrons will have energies of 2 keV as they strike the ground potential surface of work piece 242. The impact of the electrons in the electron beam 218 upon the work piece 242 causes the ejection of secondary electrons 246 with a maximum energy of 2 keV.

The positive charge on middle lens element 208 will attract secondary electrons 246 and accelerate them back up the optical column 204 where they are bent towards secondary electron detector 228 by the magnetic deflector 234. Traditional side-mounted secondary particle collection systems require that the final lens be placed at a sufficient distance from the work piece to accommodate the particle collection apparatus. Increasing the distance from final lens to the work piece necessitates using a final lens having a longer focal length, which typically degrades the resolution of the FIB system. The invention can also detect secondary particles using a conductive plate positioned between the work piece and the final lens and having an aperture passing the primary beams.

In the system of FIG. 2, however, secondary electrons 246 are collected along the optical axis of the ion beam column. The secondary electrons 246 are accelerated through the final lens 202 in a manner such that the resolution of the FIB beam 238 is not significantly degraded and then the secondary electrons 246 are deflected away from the ion column optical axis toward a secondary electron detector 228.

This through-the-lens (TTL) detector arrangement allows the work piece to be placed close to the final lens, thus shortening its focal length and providing improved column optical performance (greater current into the same beam diameter). Through-the-lens collection of secondary particles also eliminates the shadowing that results from collecting secondary particles to one side of the work piece. By using appropriate voltages, secondary ions can also be collected through the final lens. Through-the-lens electron detection in an electron beam column is known and described, for example, in U.S. Pat. No. 6,218,664 to Krans et al. for "SEM Provided With An Electrostatic Objective And An Electrical Scanning Device" (hereinafter "Krans"), which is assigned to the assignee of the present invention.

In the Krans design, the lens center element and upper element (and optionally the lower element) are biased to positive potentials to draw the electrons from the work piece up and above the lens, where they are detected by a channel plate electron multiplier, which is oriented roughly perpendicularly to the ion column axis and which has a hole in its center to pass the primary beam. However, the optics required by a FIB column are significantly different from a low voltage SEM column, such as the Krans design. Thus significant modification to the ion optics, different from those described by Krans et al. for an electron column, are required to provide TTL capability in an ion column.

The mass-to-charge ratio for ions employed in FIB systems is orders of magnitude higher than for electrons, and in addition, the energies are much higher. Applicants realized that a simple magnetic field transverse to the primary and secondary electron beam paths can be employed to deflect the electrons off-axis with minimal disturbance to the primary ion beam.

To illustrate the relative effect of the magnetic deflector on the ion beam, applicants calculate the strength of a magnet required to bend the secondary electrons through a desired bending radius, and then determine the ion beam bending radius produced by that magnetic field. The strength of the bending magnet is given by the cyclotron radius equation $$R=mv/Be \qquad (1)$$

where m is the mass, v is the velocity of the charged particle; B is the magnetic field strength, and e is the electron charge. Substituting the energy and mass into Equation 1 gives $$R=(2\ Em)^{1/2}/Be \qquad (2).$$

For electrons, it can be shown that B times R (gauss-cm)= 3.37 $E^{1/2}$ (where E is in eV). Therefore, if we use R=5 mm to bend the beam of secondary electron through a 5 mm radius and E=2000 eV as the maximum energy of secondary electrons accelerated upward beyond the final lens, then a magnetic field of B=301 gauss is required.

Gallium primary ions have the same charge as electrons but each gallium ion has a mass about 128,000 times the mass of an electron. Furthermore, the electron energies are typically about 15 times less than the ion energy. Using Equation 2, we see that the cyclotron radius for the primary ions is typically about 1550 times larger than the electron cyclotron radius or about 7.75 meters. Because the ions are only subjected to the magnetic field for a brief period, the disturbance to the primary ion beam path is small. In fact the path deviation is only about 1.2 milli-radians, which can be very easily corrected with beam steering. It can also be shown that the predominate aberration introduced into the primary ion beam by the magnetic field is chromatic and can mostly be neglected.

Figure 3A:
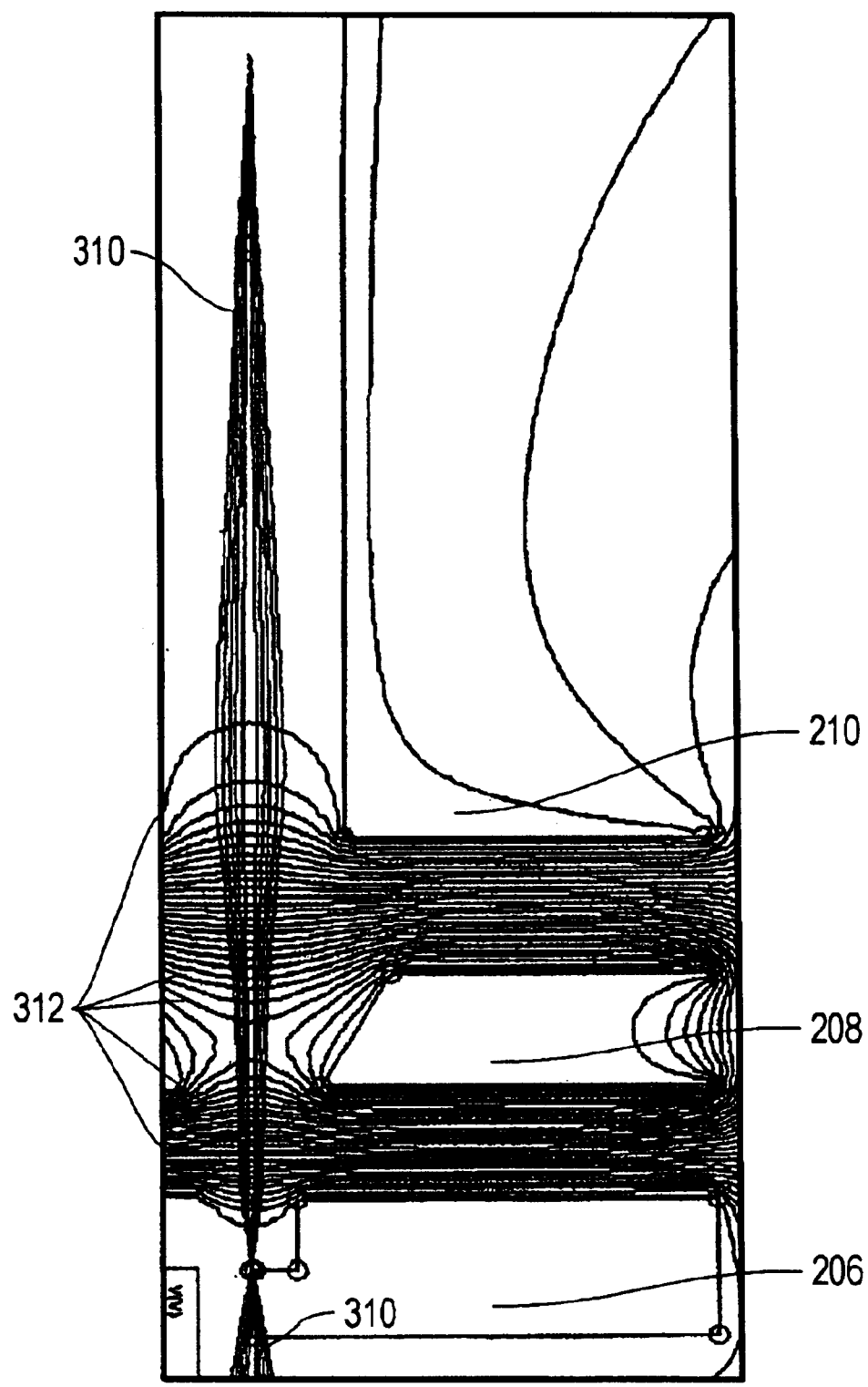
FIG. 3A is a computer simulation of primary electron trajectories with a 2 mm lower lens element bore in the system of FIG. 2.
Figure 3B:
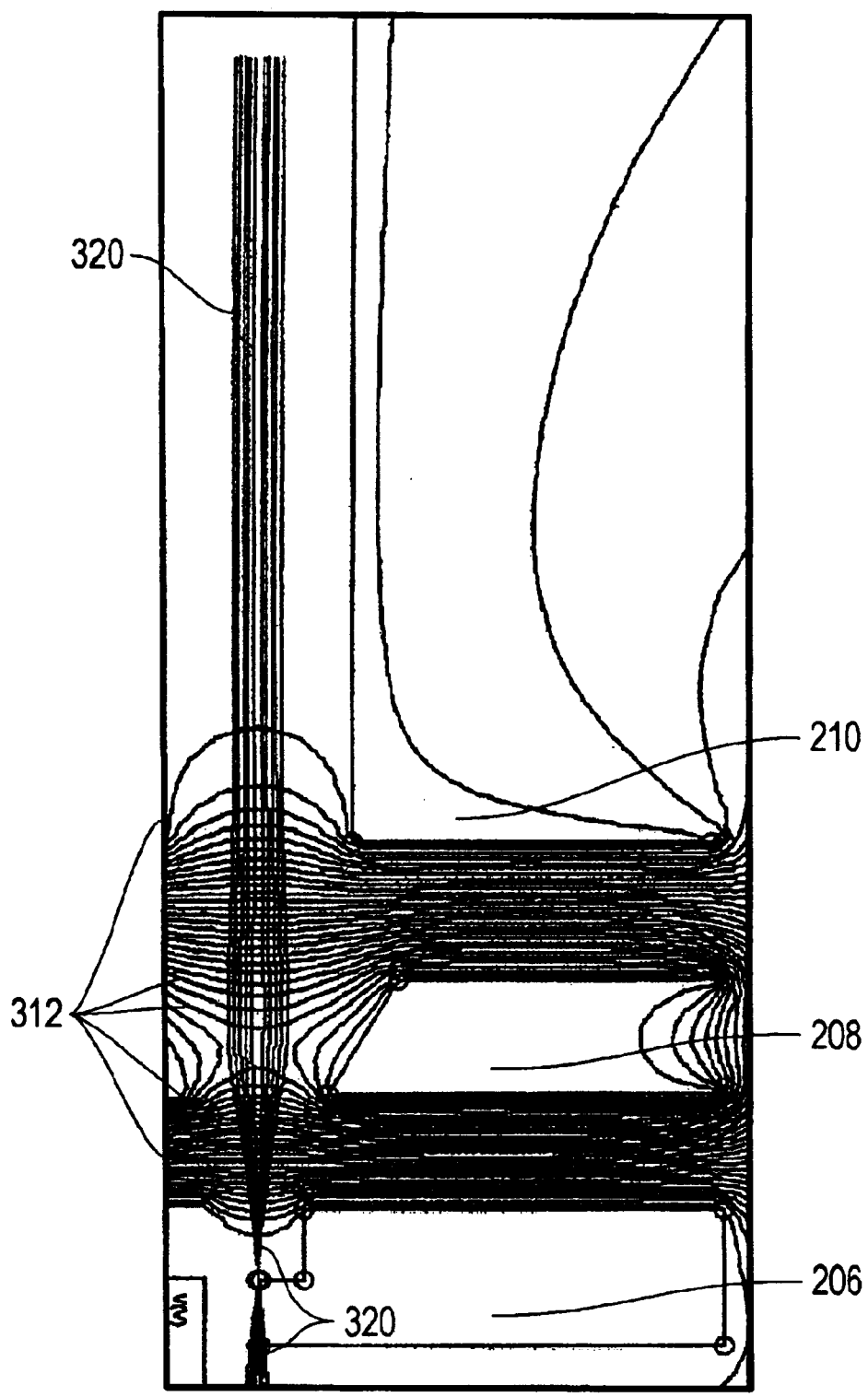
FIG. 3B is a computer simulation of primary ion trajectories in the system of FIG. 2 with a 2 mm lower lens element bore.
Figure 3C:
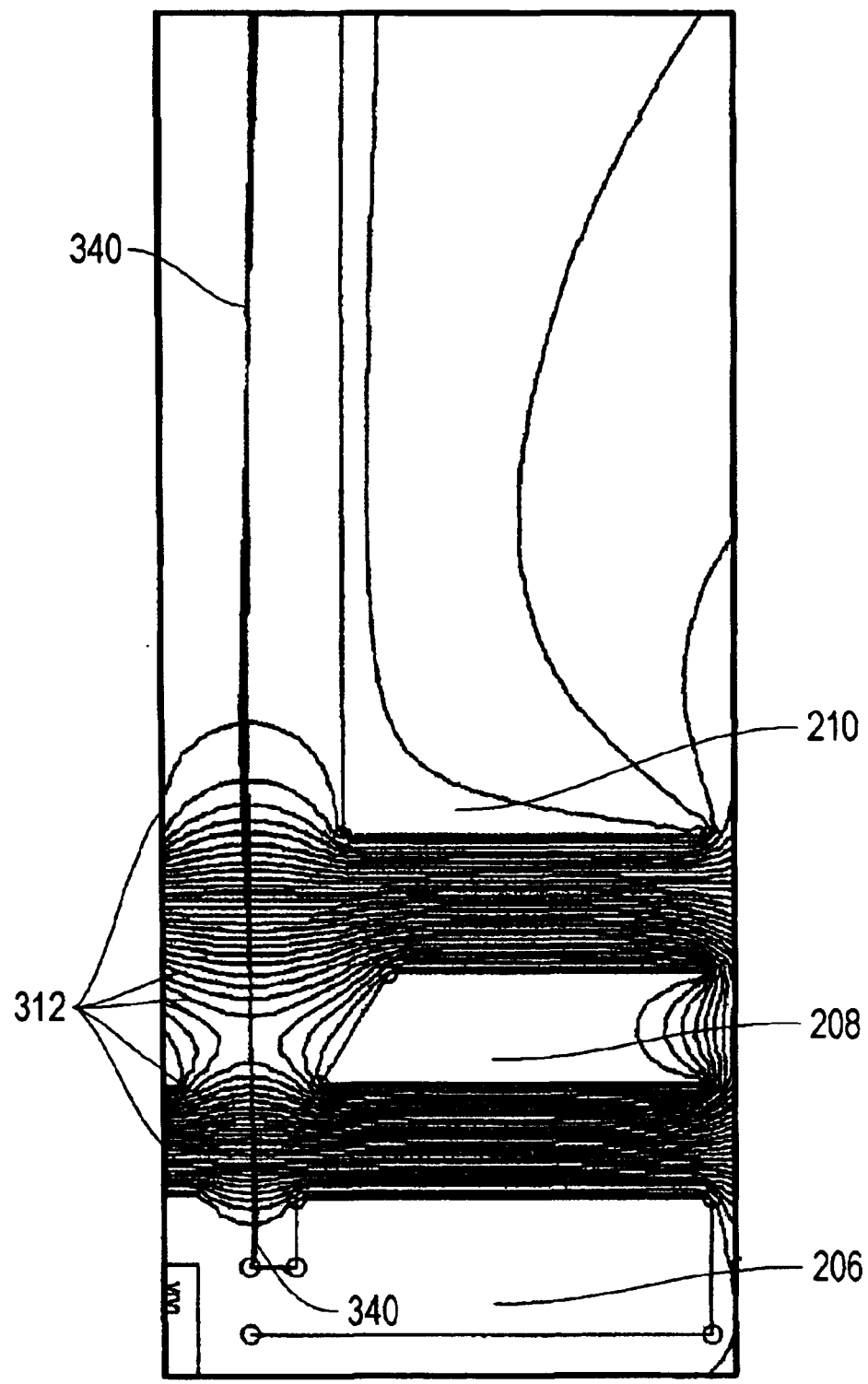
FIG. 3C is a computer simulation of secondary electron trajectories in the system of FIG. 2 with a 2 mm lower lens element bore.

FIGS. 3A, 3B, & 3C are simulations of the trajectories of primary electrons, primary ions, and secondary electrons, respectively, prepared using the Lorentz 2D program available from Integrated Engineering Software, Manitoba, Canada. The Lorentz program is an ion optics simulation program designed to study and analyze ion optics in both two and three dimensional modes or views. Using this program, electrostatic and magnetic potential arrays can be studied with this software to determine their effect on ion trajectories. Respectively, these figures show Lorentz simulations of primary ion, primary electron, and secondary electron trajectories through the optical column in the system of FIG. 2 with a final lens design having a 2 mm lower lens bore. The distance from the SEM electron object to the image is 53 mm.

For FIGS. 3A, 3B, & 3C, the simulation is programmed with a voltage on lower lens element 206 of −1 kV; the voltage of middle lens element 208 is set at +40,000 V; and the voltage of upper lens element 210 is set at ground potential.

FIG. 3A is a computer simulation of primary electron trajectories with a 2 mm bore in lower lens element 206 in the system of FIG. 2. Primary electron trajectories 310 pass through equipotential lines 312 generated by final lens 202. For FIG. 3A, the energy of the electrons approaching the top element of the upper lens is programmed to be 4,300 eV, and the electron landing energy is therefore 3300 eV.

The angle, Ao, of incoming electrons shown in the simulation varies from Ao=+0.05 to Ao=−0.05 radians and rays are shown in 0.01 radian intervals. The spherically aberrated disk of least confusion (Dsi) is determined from the simulation to be 33.0 μm. The chromatic aberration disk (Dci) is determined to be 27.6 μm using incoming electrons having an energy variation, ΔE, of 100 eV. (The values for Ao and ΔE were chosen for ease of calculation; in practice both values would be substantially lower.) The half angle, Ai, of electrons exiting the lens is 0.160 radians and thus the magnification is 0.325.

FIG. 3B is a computer simulation of primary ion trajectories in the system of FIG. 2 with a 2 mm bore in lower lens element 206. Primary ion trajectories 320 pass through equipotential lines 312 generated by final lens 202. The ions have an incoming kinetic energy of 44 keV and a landing energy of 45 keV. The incoming ions are parallel to the axis and exit the lens at a half angle of 0.095 radians. The beam has a disk of least confusion of 30 μm and a variation in energy of 100 eV gives a chromatic aberration disk of 9.5 μm.

FIG. 3C is a computer simulation of 10 eV secondary electron trajectories in the system of FIG. 2 with a 2 mm bore in lower lens element 206. Secondary electron trajectories 340 pass through equipotential lines 312 generated by final lens 202 and move back up the column, in the direction opposite to the direction of movement of the electrons and ions in FIGS. 3A and 3B.

The optical properties for the system of FIG. 2 with a 2 mm lower lens bore are estimated in Table 1 below. The calculations for Table 1 assume that that middle lens element 208 is maintained at 40 kV, the SEM source is at 12 mm, and the work piece is at 65 mm.

TABLE 1

Lorentz Simulated Optical Properties

| Work piece Voltage (kV) | SEM Properties | | | | | | | | FIB Ei (kV) | TTL Second. Electrons | | |
|---|---|---|---|---|---|---|---|---|---|---|---|---|
| | Eo (keV) | Ei (keV) | Ai (rad) | M2 | Dsi (um) | Dc (um) | Cs (mm) | Cc (mm) | | E (eV) | A Max (rad) | T % |
| −0.1 | 4.2 | 4.1 | 0.135 | 0.33 | 32.5 | 27.8 | 26.42 | 8.4 | 44.1 | 10–100 | 0.7 | 25 |
| −1 | 4.3 | 3.3 | 0.16 | 0.32 | 33 | 27.6 | 16.11 | 5.7 | 45.0 | 10–100 | 1.4 | 98 |
| −2 | 4.5 | 2.5 | 0.2 | 0.30 | 33 | 27.4 | 8.25 | 3.4 | 46.0 | 10–100 | 1.3 | 85 |
| −3 | 4.9 | 1.9 | 0.27 | 0.29 | 37.6 | 28.3 | 3.82 | 2.0 | 47.0 | 10–100 | 1.4 | 98 |
| −5 | 6.4 | 1.4 | 0.463 | 0.24 | 84.3 | 37.3 | 1.70 | 1.1 | | | | |
| −10 | 11.0 | 1 | 0.48 | 0.19 | 65.1 | 41.1 | 1.18 | 0.9 | 54.3 | 10–100 | 1.3 | 85 |

Figure 4:
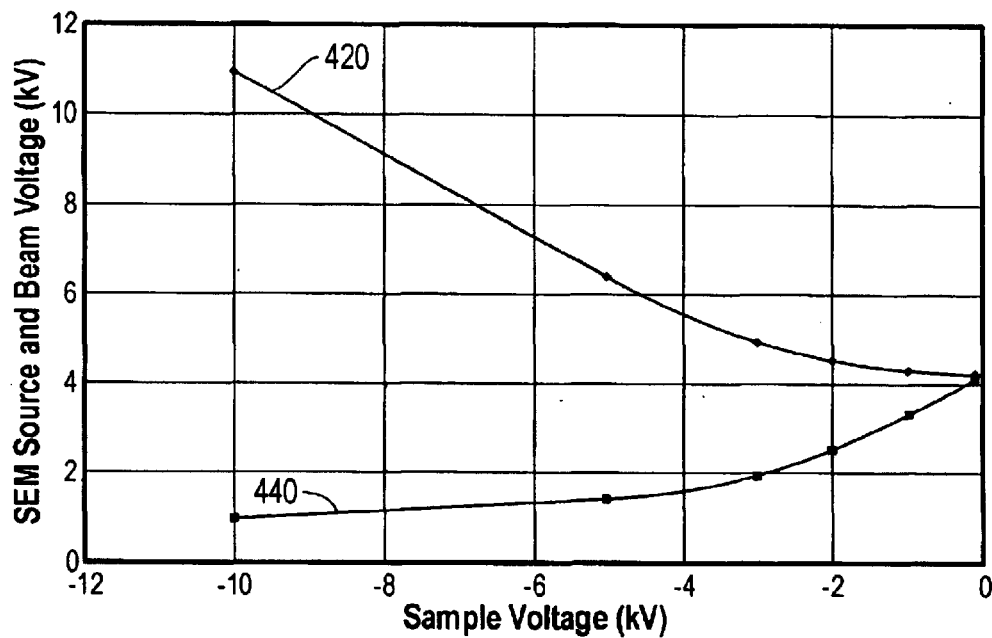
FIG. 4 shows the SEM gun and SEM beam voltages as a function of work piece voltage in the system of FIG. 2 with a 2 mm lower lens element bore.

Eo = electron gun energy
Ei = work piece landing energy
Ai = angle of electrons at work piece
M2 = source magnification
Dsi = disc of least confusion
Dc = chromatic disk
Cs = spherical aberration coefficient
Cc = chromatic aberration coefficient
FIB Ei = ion landing energy
E = energy of secondary electrons collected
A max = half angle of secondary electrons collected
T = percentage of secondary electrons collected FIG. 4 shows SEM source voltage and SEM beam voltage 440 in the system of FIG. 2 with a 2 mm lower lens element bore and varied work piece voltages. SEM beam voltage 440 (also known as landing energy) is the difference between SEM source voltage 421 and the work piece voltage. As illustrated by FIG. 4, by varying SEM source voltage 420 and work piece voltage, applicants can achieve landing energies from 1 kV to over 4 kV.

Figure 5:
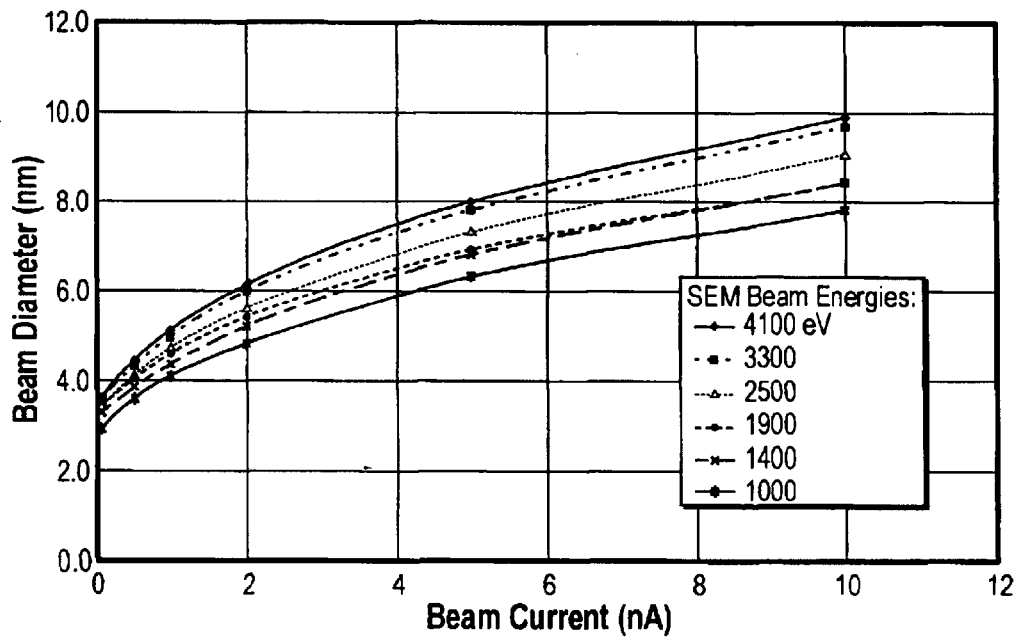
FIG. 5 shows SEM beam diameter versus beam current in the system of FIG. 2 with a 2 mm lower lens element bore.

FIG. 5 shows the relationship between SEM beam diameter and beam current for a number of different SEM beam energies in the system of FIG. 2 with a 2 mm lower lens element bore. The model illustrated in FIG. 5 employs a factor of 0.34 times the chromatic aberration term to better estimate beam resolution. The optimum demagnification of the electron object was 0.4 at 10 nA, 0.17 at 1 nA, and 0.05 at 0.05 nA in these calculations for the 4.1 kV electron beam at the work piece. For the 1 kV beam the demagnification values were 0.33 at 10 nA, 0.15 at 1 nA, and 0.043 at 0.05 nA. Not included in these calculations are the beam interactions and bending magnet aberrations upon the electron beam. As shown by the graph, the beam resolution even at the relatively high beam current of 10 nA is still less than 10 nm and sufficient to accurately process the work piece. The invention thus provides selectivity in electron landing energies without altering the potential on the high voltage center element and without changing the working distance, all while maintaining the beam diameter of less than 10 nm.

Figure 6A:
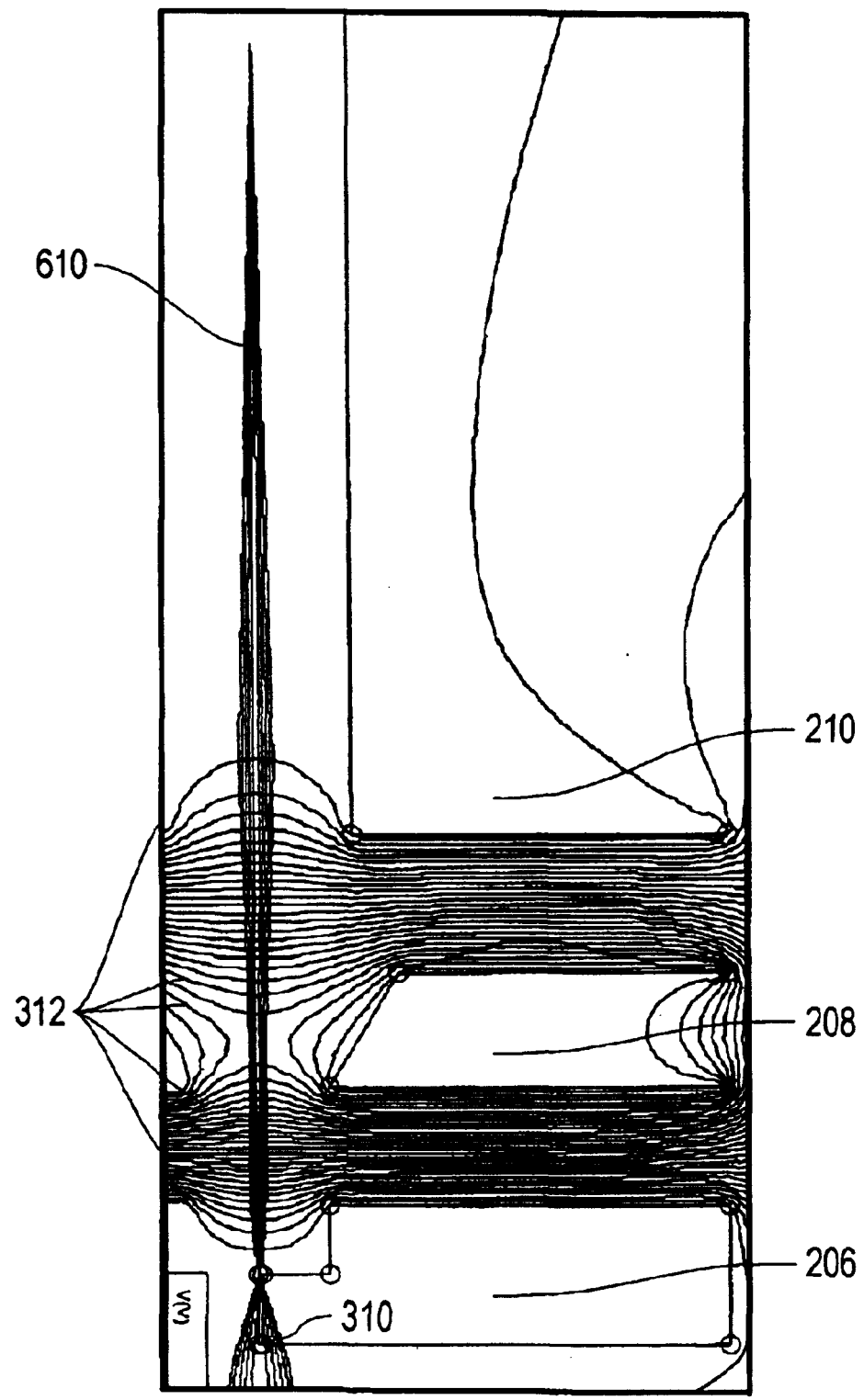
FIG. 6A is a computer simulation of primary electron trajectories in the system of FIG. 2 with a 3 mm lower lens element bore.
Figure 6B:
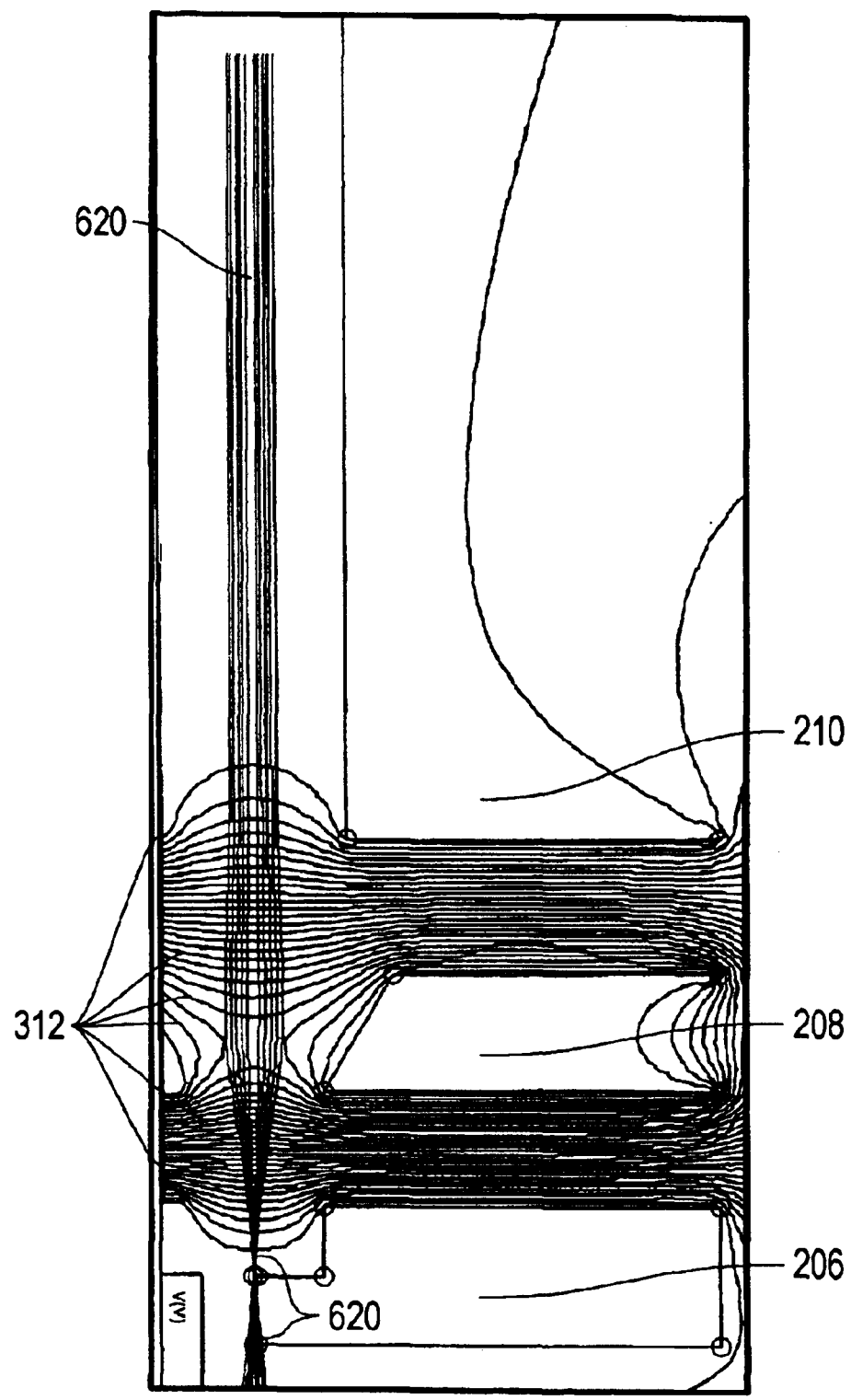
FIG. 6B is a computer simulation of primary ion trajectories in the system of FIG. 2 with a 3 mm lower lens element bore.
Figure 6C:
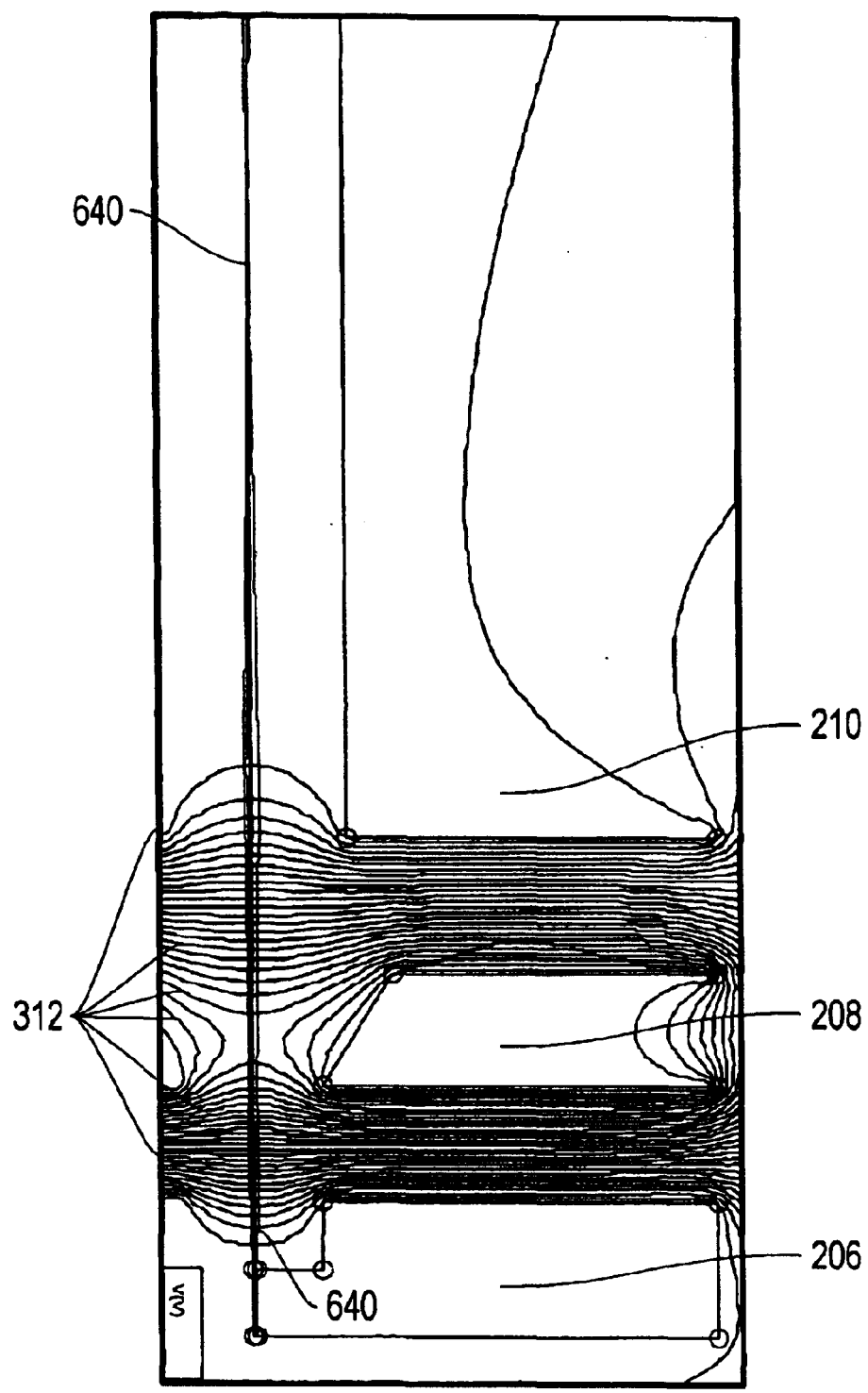
FIG. 6C is a computer simulation of secondary electron trajectories in the system of FIG. 2 with a 3 mm lower lens element bore.

Like FIGS. 3A, 3B, and 3C, FIGS. 6A, 6B, and 6C were prepared using the Lorentz program discussed above and show Lorentz simulations of primary electron, primary ion, and secondary electron trajectories through the optical column in the system of FIG. 2, but the trajectories in FIGS. 6A, 6B, and 6C were calculated with a final lens element having a 3 mm lens bore. This design allows a lower SEM beam the direction of movement of the electrons and ions in FIGS. 6A and 6B.

The optical properties for the system of FIG. 2 with a 3 mm lower lens element bore are estimated in Table 2 below. The calculations for Table 2 assume that middle lens element 208 is maintained at 40 kV, the SEM source is at 12 mm, and the work piece is at 65 mm.

TABLE 2

| Work piece | Lorentz Simulated Optical Properties | | | | | | | | | | |
|---|---|---|---|---|---|---|---|---|---|---|---|
| | SEM Properties | | | | | | | | FIB | TTL Second. Electrons | |
| Voltage (kV) | Eo (keV) | Ei (keV) | Ai (rad) | M2 | Dsi (um) | Dc (um) | Cs (mm) | Cc (mm) | Ei (kV) | E (eV) | A Max (rad) | T % |
| −1 | 4.00 | 3.0 | 0.133 | 0.36 | 36.1 | 31.0 | 30.69 | 7.0 | 44.9 | 10–100 | 1.0 | 50 |
| −2 | 4.20 | 2.2 | 0.166 | 0.35 | 36 | 31.6 | 15.74 | 4.2 | 45.9 | 10–100 | 1.1 | 61 |
| −3 | 4.40 | 1.4 | 0.211 | 0.34 | 36.5 | 32.2 | 7.77 | 2.1 | 46.9 | 10–100 | 0.9 | 41 |
| −5 | 5.25 | 0.25 | 0.302 | 0.3 | 7 | 27.6 | 0.51 | 0.2 | 49.0 | 10–100 | 0.9 | 41 | voltage at the work piece (250 eV), but reduces the maximum beam voltage at which 10 nm resolution can be achieved. The optical properties of the 3 mm bore design are shown in Table 2 and FIGS. 7–8, which are similar to the corresponding table and FIGS describe above for the 2 mm lens bore design. For the simulation of FIGS. 6A, 6B, & 6C, the voltage on lower lens element 206 is set to −5 kV; the voltage of middle lens element 208 is asset to +40,000 V; and the voltage of upper lens element 210 is set at ground potential.

FIG. 6A is a computer simulation of primary electron trajectories in the system of FIG. 2 with a 3 mm lower lens element bore. Primary electron trajectories 610 pass through equipotential lines 312 generated by final lens 202. For FIG. 6A, the kinetic energy of the electrons entering the final lens is assumed to be 5250 eV, and the electron landing energy at a work piece biased to −5,000 volts is therefore 250 eV. The angle, Ao, of incoming electrons shown in the simulation varies from Ao=+0.025 to Ao=−0.025 radians and rays are shown in 0.005 radian intervals.

The disk of least confusion (Dsi) is determined to be 7.0 μm, while the chromatic aberration (Dci) is determined to be 27.6 μm (using ΔE=100 eV). (Again, the values for Ao and ΔE were chosen for ease of calculation; in practice both values would be substantially lower.) The half angle, Ai, of electrons exiting the lens is 0.302 radians and the magnification is 0.30.

FIG. 6B is a computer simulation of primary ion trajectories in the system of FIG. 2 with a 3 mm lower lens element bore. Primary ion trajectories 620 pass through equipotential lines 312 generated by final lens 202. The ions have an initial kinetic energy of 44 keV and enter the final lens as a collimated beam, that is, parallel to the optical axis. The ions have landing energies at the −5 kV work piece of 49 keV. The ion cone after the final lens has an angle, Ai, of 0.087. The disk of least confusion is 30 μm and a presumed 100 eV energy provides a chromatic disk of 7.4 μm.

Figure 6D:
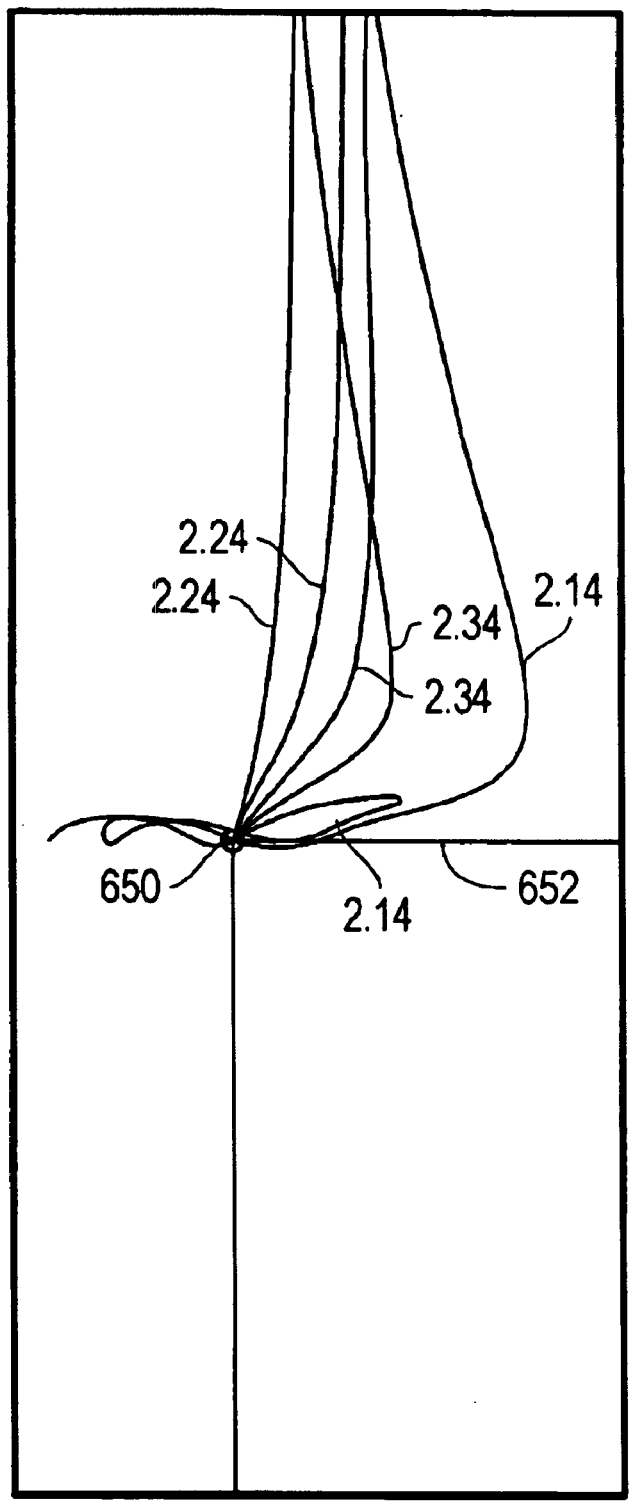
FIG. 6D is a close-up of the work piece region of FIG. 6C.

FIG. 6C is a computer simulation of secondary electron trajectories in the system of FIG. 2 with a 3 mm lower lens element bore. Secondary electron trajectories 640 pass through equipotential lines 312 generated by final lens 202 and move back up the column, in the direction opposite to FIG. 6D is a close-up of the sample region of FIG. 6C showing the trajectories of 10 eV secondary electrons emitted from the work piece and being accelerated back up through the final lens by the high voltage on the center element. The numbers on FIG. 6D represent the emission angles in radians as measured from an extension 650 of the optical axis extending beyond the flat work piece 652. Electrons emitted within a cone having a half angle of 0.9 radians about the optical axis are accelerated back up through the final lens; electrons emitted at greater angles to the optical axis (that is, smaller angles to the work piece surface) will not pass through the final lens for collection. As the secondary electron energy increases from 10 eV to 100 eV, fewer electrons will be accelerated up through the lens for collection. The 3 mm bore diameter design gives TTL transmissions of 40% or more. This is a relatively high transmission efficiency compared to prior art detectors that collect secondary electrons off the optical axis using a short working distance objective lens, and the use of TTL detection also allows a shorter working distance. The 2 mm bore design gives transmissions approaching 100%. Depending upon the design of the optical column, additional electrons may be lost further up the column, that is, the secondary electron transmission-limiting angle can occur at the work piece or high in the column.

Figure 7:
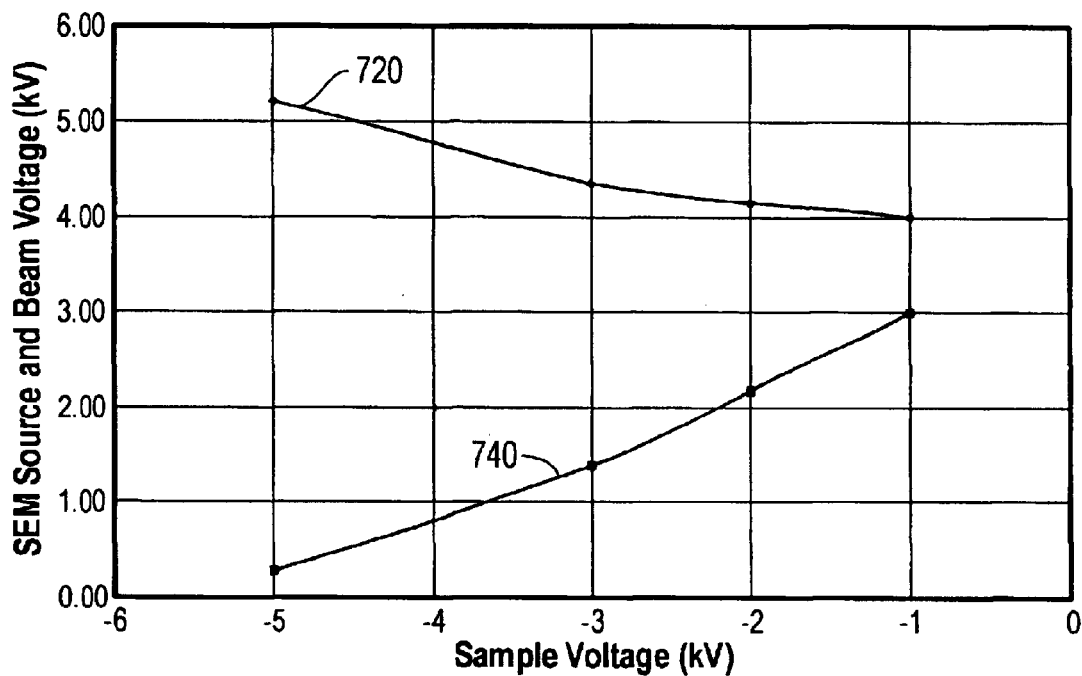
FIG. 7 shows the SEM gun and SEM beam voltages as a function of work piece voltage in the system of FIG. 2 with a 3 mm lower lens element bore.

FIG. 7 shows SEM gun voltage 720 and SEM beam voltage 740 in the system of FIG. 2 with a 3 mm lower lens element bore at various work piece voltages. SEM beam voltage 740 is the difference between SEM source voltage and work piece voltage. The 3 mm lower lens bore has similar optical properties as the 2 mm lower lens bore in FIG. 4. As illustrated by FIG. 7, by varying SEM source voltage 420 and work piece voltage, applicants can achieve landing energies from 250 V to 3 kV. Thus, comparing FIG. 4 to FIG. 7 shows that the 3 mm lower lens bore allows lower SEM beam voltage at the work piece (250 eV), but sacrifices the maximum beam voltage (3 kV).

Figure 8:
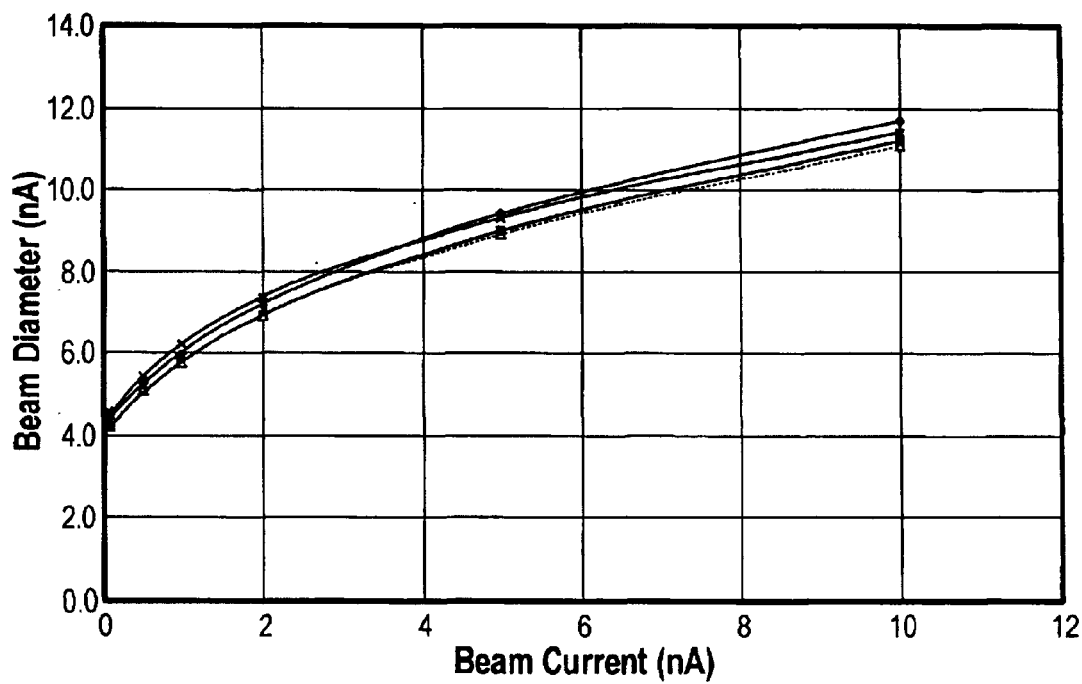
FIG. 8 shows SEM beam diameter versus beam current in the system of FIG. 2 with a 3 mm lower lens element bore.

FIG. 8 shows the relationship between SEM beam diameter and beam current for a number of different SEM beam energies in the system of FIG. 2 with a 3 mm lower lens element bore. When compared to FIG. 5, FIG. 8 shows that the 3 mm lens bore design and the 2 mm lens bore design will have similar optical properties. As shown by the graph, even using the 3 mm lens bore, the beam resolution at 10 nA, is still less than 12 nm, which is sufficient to process the work piece accurately. At currents less than 6 nA, the beam diameter is less than 10 nm.

Figure 9A:
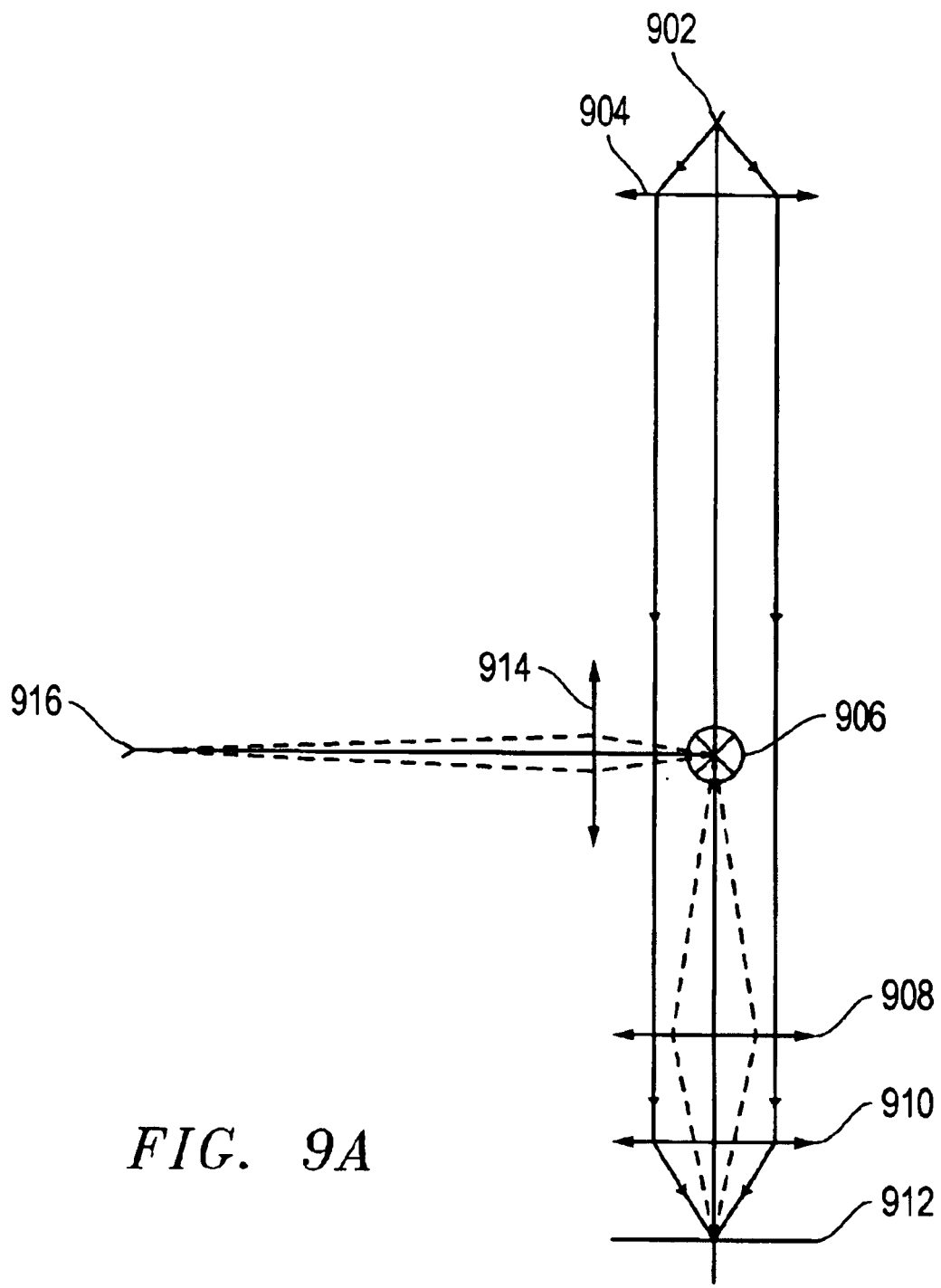
FIG. 9A is a schematic cross-sectional view of the FIB-SEM optics in the system of FIG. 2.

FIG. 9A is a schematic cross-sectional view of the FIB-SEM optics in the system of FIG. 2. In a preferred embodiment, the ion source 902 is a liquid metal ion source (LMIS) using high brightness gallium (Ga). The ions emitted from the ion source 902 are focused onto the work piece 912 by the condenser lens 904 and FIB objective lens 910.

Electron beam gun 916 comprises an electron emission source (not shown), such as a Schottky field emission source, and electron optical components (not shown) that form the electrons into a beam and accelerate them to a desired energy. Such an electron beam gun 916 is commercially available, for example, from FEI Company, Hillsboro, Oreg., the assignee of the present invention.

A three element condenser lens 914 positioned after electron beam gun 916 further accelerates the primary electrons to a crossover roughly at the center of bending magnet 906. The first and third elements of condenser lens 914 are preferably maintained at an electrical potential of approximately +2 kV. The electrons from electron beam gun 916 are deflected by a magnetic deflector 906 (or electrostatic shield inside the magnetic deflector), which is maintained at a potential of approximately +2,000 V, towards a primary ion beam axis (not shown). The electron beam is focused onto work piece 912 by SEM objective lens 908.

Figure 9B:
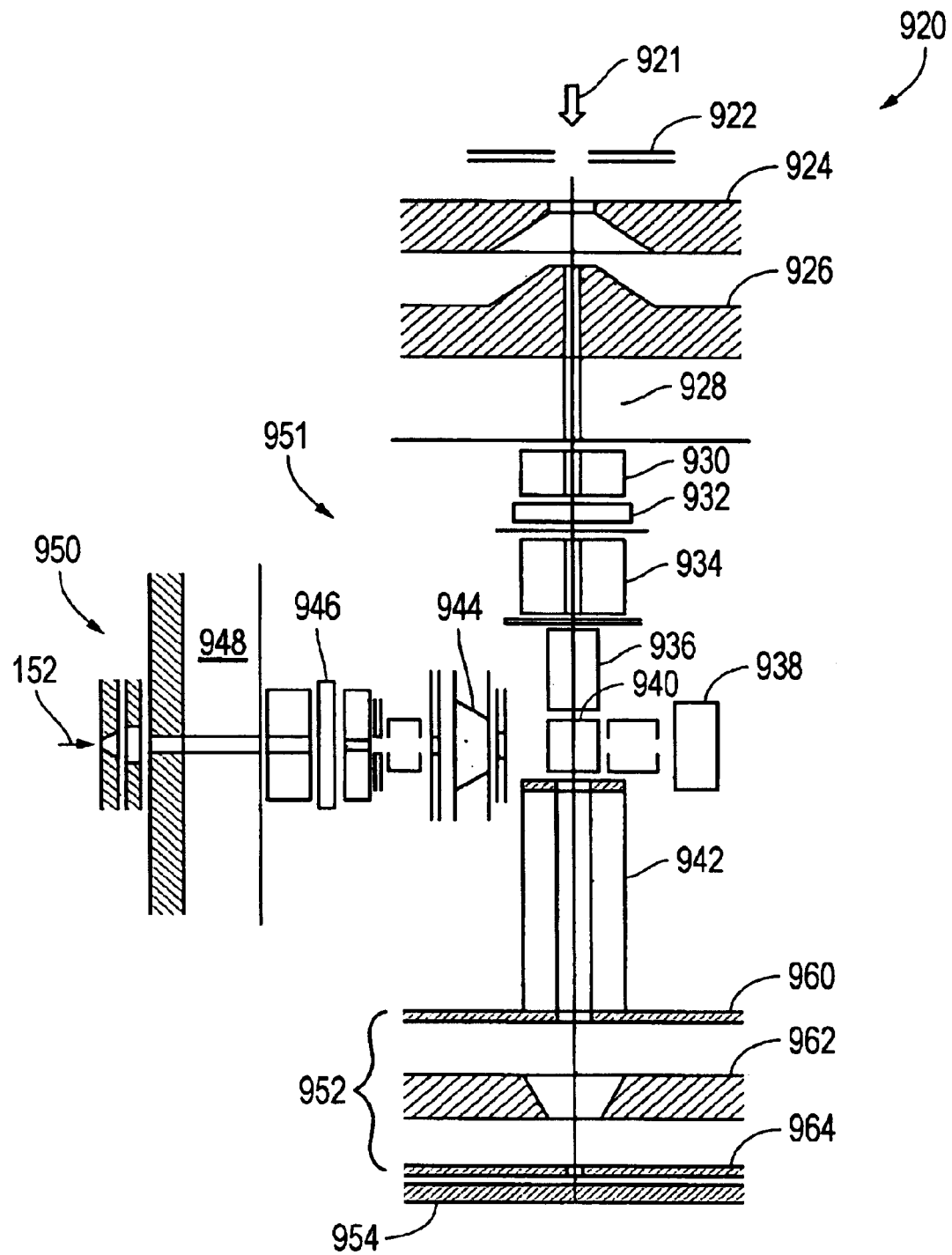
FIG. 9B is a schematic cross-sectional view of the FIB-SEM column in the system of FIG. 2.
Figure 9C:
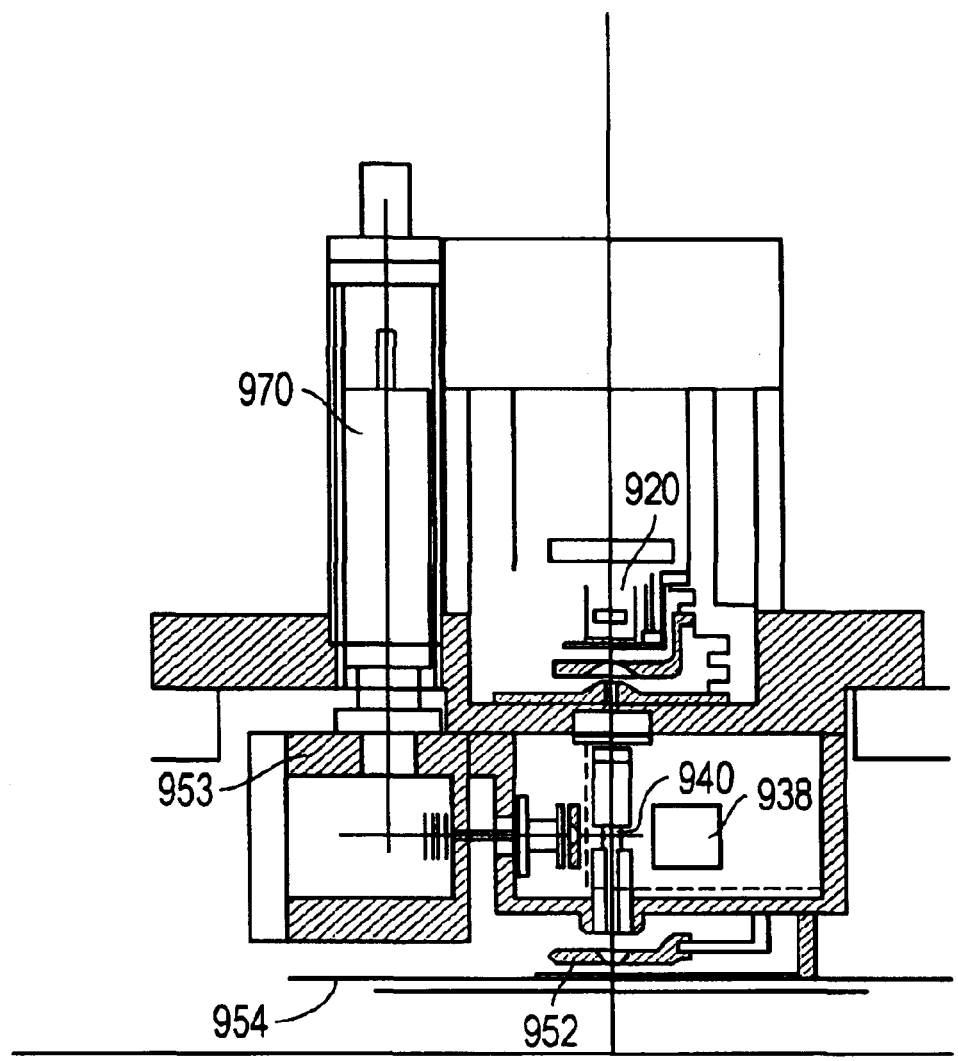
FIG. 9C is a schematic cross-sectional view of the side of the FIB-SEM column in the system of FIG. 2.

FIG. 9B and FIG. 9C are schematic cross-sectional views of the FIB-SEM column in the system of FIG. 2. Ion optical system 920 includes the ion source 921. In a preferred embodiment, ion source 921 is a liquid metal ion source (LMIS) using high brightness gallium (Ga). Ions are pulled off ion source 921 by a high voltage extractor 922. The ion beam is focused by the condenser lens 924 and the final lens 952. A FIB isolation valve 928 can be used to isolate ion source 921 from the rest of the vacuum chamber. The FIB automatic variable aperture (FIB AVA) 932 can be set for the desired current to the work piece. Beam blanker 934 gives the option to blank the beam so no ions can hit the work piece. Ion beam current can be measured using optional faraday cup 936. Finally, the ion beam is scanned across the surface of work piece 954 by beam deflection plates 942.

Electron optical system 951 includes an electron gun 950, which comprises an electron emission source 952, such as a Schottky field emission source, an extractor, first condenser lens 944 that forms the electrons into a beam and accelerates them to a desired energy. Such an electron gun 950 is commercially available, for example, from FEI Company, Hillsboro, Oreg., the assignee of the present invention.

Condenser lens 944 is preferably biased at an electrical potential of approximately +2 kV. Electron beam source 950 is maintained in an ultrahigh vacuum chamber (not shown) to maintain stable electron emission from the field electron emitter. An SEM isolation valve 948 can be used to vacuum isolate electron beam source 950 from the rest of the vacuum chamber. Electron optical system 951 also includes steering and blanking electrodes 946. Another condenser lens can be added for variable source demagnification.

The electrons from electron beam source 950 are deflected by a magnetic deflector 940, which is maintained at a potential of approximately +2,000 V, towards a primary ion beam axis (not shown). The electron beam is focused onto work piece 954 by final lens 952, having an upper element 960, and middle element 962, and a lower element 964. The bore of middle lens element 962 is preferably tapered, and the bore of lower lens element 964 is the same size or smaller than the bore of upper lens element 960.

The impact of the ions in the ion beam and the electrons in the electron beam with the work piece both cause the ejection of secondary electrons (not shown). The secondary electrons will travel back up the optical column (not shown) where they are bent towards secondary electron detector 938 by the magnetic deflector 940. An ion pump 970, supported by electron gun chamber 953, provides ultrahigh vacuum in that gun chamber 953.

Figure 10:
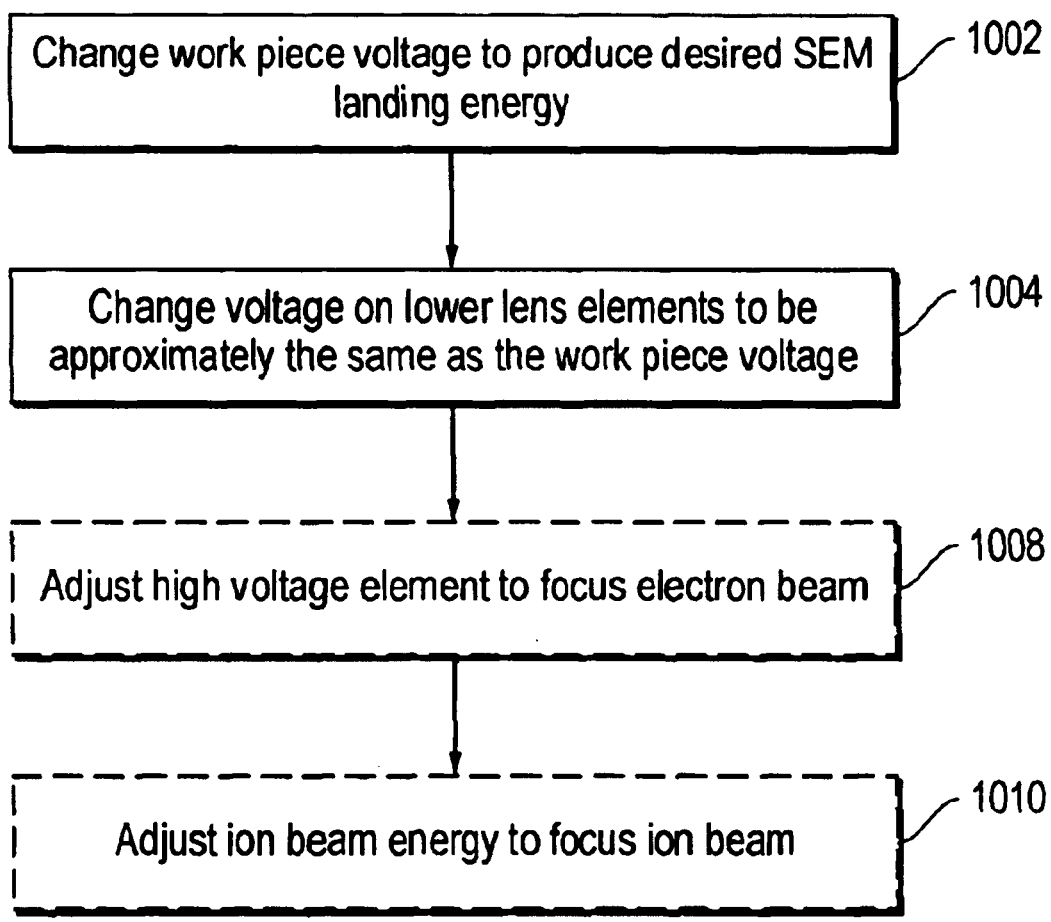
FIG. 10 is a flow chart showing the preferred steps for changing the electron landing energy in an embodiment of the invention.

An advantage of some embodiments of the invention is that the energy of the electron beam can be readily changed. FIG. 10 is a flow chart showing the steps used to adjust the electron voltage in an embodiment in which the second group of elements, as defined above, is at approximately ground potential and the first group of elements are electrically biased. In step 1002, the work piece voltage is changed so that the electrons from electron gun 220 have the desired landing energy. For example, if the electrons leaving electron gun 220 have a kinetic energy of 1000 eV and a landing energy of 500 eV is desired, the work piece potential is adjusted to −500 V. In step 1004, the potential on lower lens element 206 is adjusted to approximately match the potential on the work piece 242. "Approximately match" is used to mean within 1,000 V, more preferably within 100 V, and most preferably within 50V. In optional step 1008, the voltage on center lens element 208 is adjusted slightly to focus the electron beam onto work piece 242. Because only a small change in voltage is required, only minimal time is required for the high voltage to stabilize at the new level. In optional step 1010, energy of the ion beam is adjusted at the ion gun to compensate for the change in focus caused by changing the voltage on center lens element 208, lower lens element 206, and work piece 242. The energy of the ion beam is adjusted by superimposing a biasing voltage on the ion gun, that is, uniformly biasing the emitter, suppressor, and extraction electrode, and not changing the relative potential among those elements. It may also be necessary to slightly adjust the voltage on the first ion lens. Thus, steps 1002 and 1004 change the electron landing energy, step 1008 ensures that the electron beam remains properly focused, and step 1010 ensures that the ion beam remains properly focused. The order in which the steps shown in FIG. 10 are performed can be changed without affecting the utility of the steps.

In an embodiment in which the work piece is at approximately ground potential, the steps are analogous, that is, upper lens element 210, electrostatic deflectors 212, magnetic deflector 234, and electron source 221 are adjusted to the proper potential to provide the desired electron landing energy. The electron beam is then focused by adjusting the high voltage on lens elements 208, and then the ion beam energy is adjusted so that the ion beam is brought back into focus on work piece 242.

A preferred system of the present invention has many novel aspects, and because the invention can be embodied in different systems for different purposes, not every aspect need be present in every embodiment. Moreover, many of the aspects of the described embodiments may be separately patentable.

In accordance with one aspect of a preferred embodiment of the invention, a focused ion beam system and a scanning electron microscope system are combined into one apparatus with coaxial alignment between the particle beams of the two systems.

In accordance with another aspect of a preferred embodiment of the invention, the apparatus uses through-the-lens (TTL) detection of secondary electrons, which can improve secondary electron collection efficiency.

In accordance with another aspect of a preferred embodiment of the invention, a positively biased final electrostatic lens is used to focus both the electron beam and ion beam without changing the lens voltage.

In accordance with another aspect of a preferred embodiment of the invention, the design of the apparatus allows alternate or simultaneous SEM and FIB operation.

In accordance with another aspect of a preferred embodiment of the invention, work piece bias is utilized to vary electron beam voltage with only a minor effect upon the ion beam voltage.

In accordance with another aspect of a preferred embodiment of the invention, an electron beam column and an ion beam share a non-unipotential final lens.

In accordance with another aspect of the invention, the system allows the energy of the electron beam to be changed without requiring a change in the electrical potential of the high voltage element of the final lens and without changing the working distance between the final lens and the work piece.

In accordance with another aspect of the invention, the present invention is of a compact design that uses a relatively small production area.

Although the present invention and its advantages have been described in detail, it should be understood that various changes, substitutions and alterations can be made to the embodiments herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus comprising:
   a source of a primary electron beam;
   an ion optical column including an ion beam generating source, said ion optical column having an optical axis;
   a deflector for deflecting the primary electron beam to travel substantially along the ion column optical axis toward the work piece; and
   a non-unipotential electrostatic final lens that focuses both the primary electron beam and the ion beam onto a work piece.

2. The apparatus of claim 1 in which the electrostatic non-unipotential lens includes at least three elements and at least three of the elements are insulated from each other and include electrical connections for applying voltages that are independent of the voltages applied to the other elements.

3. The apparatus of claim 1 in which the source of the primary electron beam includes electrical connections for biasing the primary electron beam source without changing its focal length.

4. The apparatus of claim 1 in which the deflector uses a magnetic field to deflect the primary electron beam.

5. The apparatus in claim 1 in which the deflector comprises a Wien filter or an electrostatic deflector.

6. The apparatus of claim 2 in which the non-unipotential electrostatic final lens includes a high voltage element that is maintained at a sufficiently high positive electrical potential to focus both the primary electron beam and the ion beam.

7. The apparatus of claim 6 in which the element of the non-unipotential electrostatic final lens that is nearest the deflector is maintained at approximately the same electrical potential as the deflector.

8. The apparatus of claim 7 in which the element of the non-unipotential electrostatic final lens that is nearest the deflector is maintained at a potential of between +500 V and +5,000 V.

9. The apparatus of claim 6 in which the element of the final lens that is nearest the work piece is at maintained at approximately the same electrical potential as the work piece.

10. The apparatus of claim 9 in which the element of the final lens that is nearest the work piece is at approximately ground potential.

11. The apparatus of claim 1 further comprising an electron detector for detecting secondary electrons emitted from the work piece.

12. The apparatus in claim 11 in which the electron detector is positioned between the final lens and the work piece.

13. The apparatus of claim 11 in which the electron detector detects electrons collected through the final lens.

14. The apparatus of claim 13 in which the deflector deflects secondary electrons collected through the final lens away from the optical axis and toward the electron detector.

15. The apparatus in claim 13 in which the final lens is positively biased with respect to the work piece so as to cause secondary electrons emitted from the work piece to travel from the work piece through the final lens.

16. The apparatus in claim 2 in which the final lens includes a lower lens element, a middle lens element, and an upper lens element.

17. The apparatus in claim 16 in which the final lens lower element is maintained at approximately the same voltage as the work piece to within 1,000 V, the middle lens element is maintained at a voltage of greater than +15,000 V, and the upper lens element is maintained at a voltage greater than the voltage of the lower lens element and less than the voltage of the center element.

18. The apparatus of claim 17 in which the lower lens is maintained at approximately ground potential, the center lens element is maintained at a voltage of greater than +30,000 V and the upper lens element is maintained at between about +500 V and about +5,000 V.

19. An apparatus including an ion beam column and an electron beam column, comprising:
   a source of a primary electron beam;
   an ion optical column including an ion beam generating source, said ion optical column having an optical axis;
   a detector for detecting secondary particles generated by the electron beam or the ion beam striking the work piece;
   a deflector for deflecting the primary electron beam to travel substantially along the ion column optical axis toward the work piece and for deflecting the secondary particles toward the detector; and
   a final, non-unipotential electrostatic lens that focuses both the primary electron beam and the ion beam onto a work piece and that draws secondary particles through the lens in the opposite direction of the primary electron beam.

20. The apparatus of claim 19 in which the deflector uses a magnetic field to deflect the primary electron beam.

21. The apparatus of claim 19 in which the non-unipotential electrostatic final lens includes multiple elements and in which a center element is at a sufficiently high positive electrical potential to simultaneously focus the primary electron beam and the ion beam.

22. A method for imaging and processing a work piece using an electron beam and an ion beam, the method comprising:

generating a focused ion beam including ions traveling along an ion column optical axis toward a work piece;

generating an electron beam including electrons traveling in direction different from the ion column optical axis;

deflecting the electron beam to be approximately co-axial with the ion beam;

focusing the electron beam and the ion beam onto a work piece using a single final lens;

accelerating back along the optical axis secondary particles generated when the focused ion beam or the beam of electrons strikes the work piece; and deflecting the secondary electrons toward an electron detector.

23. The method of claim 22 in which focusing the electron beam and the ion beam using a single final lens includes focusing the electron beam and the ion beam onto the work piece using a non-unipotential lens.

24. The method of claim 23 further comprising adjusting the landing energy of the electrons in the electron beam without changing the working distance by changing the electrical potential of the work piece, the electron source, or both the work piece and the electron source.

25. The method of claim 24 in which focusing the electron beam and the ion beam onto the work piece using a non-unipotential lens includes focusing the electron beam and the ion beam onto the work piece using a non-unipotential lens having at least three elements and in which the element closest to the electron source is set to approximately the potential of the electron source and the potential of the element closest to the work piece is set to approximately the potential of the work piece.

26. The method of claim 23 further comprising adjusting the range of landing energies of the electrons in the electron beam by changing the size of the opening in the lower element of the non-unipotential lens.

27. A method for imaging and processing a work piece using an electron beam and an ion beam, the method comprising:

generating a focused ion beam including ions traveling along an ion column optical axis toward a work piece;

generating from an electron source an electron beam including electrons traveling in direction different from the ion column optical axis;

deflecting the electron beam to be approximately co-axial with the ion beam; and focusing the electron beam and the ion beam onto a work piece using a single, non-unipotential final lens.

28. The method of claim 27 in which focusing the electron beam and the ion beam onto a work piece using a single, non-unipotential final lens includes focusing a non-unipotential final lens that includes at least three elements including a high voltage element and further comprising adjusting the landing energy of the electrons in the electron beam by:

changing the voltage of the work piece;

changing the voltage of the unipotential lens element that is closest to the work piece to be at approximately at the potential as the work piece; and adjusting the voltage on the high voltage element to focus the electron beam.

29. The method of claim 28 further comprising adjusting the beam energy of the ion beam to focus the ion beam.

30. The method of claim 27 in which focusing the electron beam and the ion beam onto a work piece using a single, non-unipotential final lens includes focusing a non-unipotential final lens that includes at least three elements including a high voltage element and further comprising adjusting the landing energy of the electrons in the electron beam by:

changing the voltage of the electron source;

changing the voltage of the unipotential lens element that is closest to the electron source; and adjusting the voltage on the high voltage element to focus the electron beam.

31. The method of claim 30 further comprising adjusting the beam energy of the ion beam.

32. The method of claim 27 further comprising collecting secondary electrons through the non-unipotential final lens.

33. The method of claim 27 in which:

focusing the electron beam and the ion beam onto a work piece using a single, non-unipotential final lens includes focusing a non-unipotential final lens that includes at least three elements including a high voltage element; and deflecting the electron beam to be approximately co-axial with the ion beam includes deflecting the electron beam using a magnetic deflector;

and further comprising:

setting the potential of element nearest the work piece to approximately the same potential as the work piece and setting the potential of element nearest the magnetic deflector to the same potential as the magnetic deflector.

34. The method of claim 33 in which setting the potential of element nearest the work piece to approximately the same potential as the work piece includes setting the potential of element nearest the work piece to approximately ground potential.

35. The method of claim 27 further comprising changing the available range of the electron landing energies by changing the geometry of the final lens.

36. The method of claim 35 in which changing the geometry of the final lens including changing the diameter of the lower lens elements.

* * * * *